United States Patent
Sakurai et al.

(10) Patent No.: US 6,912,155 B2
(45) Date of Patent: Jun. 28, 2005

(54) NON VOLATILE MEMORY

(75) Inventors: Ryotaro Sakurai, Hachioji (JP); Hitoshi Tanaka, Ome (JP); Satoshi Noda, Ome (JP); Koji Shigematsu, Fussa (JP)

(73) Assignee: Renesas Technology Corp., Tokyo (JP)

( * ) Notice: Subject to any disclaimer, the term of this patent is extended or adjusted under 35 U.S.C. 154(b) by 87 days.

(21) Appl. No.: 10/667,512

(22) Filed: Sep. 23, 2003

(65) Prior Publication Data
US 2004/0105324 A1 Jun. 3, 2004

(30) Foreign Application Priority Data
Sep. 25, 2002 (JP) ......................................... 2002-278905

(51) Int. Cl.[7] .............................................. G11C 16/00
(52) U.S. Cl. ............................ 365/185.02; 385/185.04; 385/228
(58) Field of Search ....................... 365/185.02, 185.04, 365/185.09, 228

(56) References Cited

U.S. PATENT DOCUMENTS

| | | | | |
|---|---|---|---|---|
| 5,301,161 A | * | 4/1994 | Landgraf et al. | ...... 365/185.04 |
| 5,892,705 A | * | 4/1999 | Chung | ........................ 365/145 |
| 5,943,257 A | * | 8/1999 | Jeon et al. | ................... 365/145 |
| 6,201,731 B1 | * | 3/2001 | Kamp et al. | ........... 365/185.02 |
| 6,822,899 B1 | * | 11/2004 | Boulos et al. | ......... 365/185.09 |

* cited by examiner

*Primary Examiner*—Tan T. Nguyen
(74) *Attorney, Agent, or Firm*—Miles & Stockbridge P.C.

(57) ABSTRACT

An electrically programmable and erasable nonvolatile semiconductor memory such as a flash memory is designed into a configuration in which, when a cutoff of the power supply occurs in the course of a write or erase operation carried out on a memory cell employed in the non-volatile semiconductor memory, the operation currently being executed is discontinued and a write-back operation is carried out to change a threshold voltage of the memory cell in the reversed direction. In addition, the configuration also allows the number of charge-pump stages in an internal power-supply configuration to be changed in accordance with the level of a power-supply voltage so as to make the write-back operation correctly executable. As a result, no memory cells are put in deplete state even in the event of a power-supply cutoff in the course of a write or erase operation.

15 Claims, 18 Drawing Sheets

SW11=SE12="OFF"

φ3=/φ3="L"
SW11="ON"
SW12="OFF"

φ2=/φ2=φ3=/φ3="L"
SW11="OFF"
SW12="ON"

NON VOLATILE MEMORY

BACKGROUND OF THE INVENTION

In general, the present invention relates to a technology serving as a countermeasure taken in the event of a power-supply cutoff in the course of an operation to write or erase information into or from an electrically programmable and erasable non-volatile semiconductor memory. More particularly, the present invention relates to such a technology effectively applied for example to a flash memory allowing bulk erasure of data stored therein to be carried out in predetermined units.

A flash memory employs a non-volatile storage device in each memory cell thereof. The non-volatile storage device includes a MOSFET having a dual-gate structure comprising a control gate and a floating gate. The amount of electric charge accumulated in the floating gate is varied so as to change a threshold voltage of the MOSFET in order to store information into the memory cell.

In an operation to write or erase information into or from a memory cell of a flash memory, the threshold voltage may be changed inadvertently to a low level. In this case, the threshold voltage may change in different ways depending on dispersions in memory-cell characteristics. In some cases, the threshold voltage decreases to 0V or a level lower than 0 V. A state in which the threshold voltage decreases to 0V or a level lower than 0 V is referred to hereafter as a deplete state. Normally, a memory cell with the threshold voltage decreased excessively is subjected to an operation known as a write-up or a write-back in order to restore the threshold voltage to a level in a predetermined range.

SUMMARY OF THE INVENTION

In the case of a flash memory used in a memory card or the like, however, the power supply may be cut off accidentally in the course of a write or erase operation due to an interruption of the power supply or a withdrawal of the memory card from its slot by a user. It is thus feared that some memory cells in a memory array of the flash memory stay in a deplete state as they are. If some memory cells are put in a deplete state in a so-called AND-type or NOR-type flash memory, currents inevitably flow through the unselected memory cells in the deplete state. As a result, there is generated a deplete-state failure making it impossible to read out data stored in a selected memory cell with a high degree of accuracy. The AND-type or NOR-type flash memory is a flash memory in which a plurality of memory cells (MC) is connected in parallel to a pair of lines, namely, a bit line BL and a source line SL as shown in FIG. 3.

If a block including a memory cell in which a deplete failure has occurred is used as a system area for storing information of importance to the system employing the flash memory, it is feared that the system is no longer capable of recognizing the memory and, as a result, the system is not capable of carrying out operations normally anymore. Examples of the information of importance to the system are table data used for managing locations of files in the memory and information on a format.

It is thus an object of the present invention addressing the problems described above to prevent memory cells employed in an electrically programmable and erasable non-volatile semiconductor memory such as a flash memory from entering a deplete state even in the event of a power-supply cutoff in the course of an operation to write or erase information into or from the memory.

It is another object of the present invention to make an external device capable of recognizing an occurrence of a power-supply cutoff in the event of the power-supply cutoff in the course of an operation to write or erase information into or from an electrically programmable and erasable non-volatile semiconductor memory such as a flash memory.

It is a further object of the present invention to prevent a system employing an electrically programmable and erasable non-volatile semiconductor memory such as a flash memory from becoming no longer capable of recognizing the memory and, as a result, becoming no longer capable of carrying out operations normally due to a power-supply cutoff occurring in the course of an operation to write or erase information into or from the memory.

The descriptions, other objects and novel characteristics of the present invention will probably be better understood from explanations given in this specification with reference to accompanying diagrams.

Outlines of representatives of the present invention disclosed in this specification are explained briefly as follows.

In accordance with an aspect of the present invention disclosed in this specification, there is provided a configuration of an electrically programmable and erasable non-volatile semiconductor memory such as a flash memory, wherein, in the event of a power-supply cutoff in the course of the operation to write or erase information into or from the memory cell, the operation now being executed is discontinued and a write-back operation to change a threshold voltage of the memory cell in a direction of increase is carried out.

In accordance with the means described above, even when the power-supply cutoff occurs before the write or erase operation is completely terminated and a memory cell in a deplete state is generated, the threshold voltage is increased by a write-back operation carried out thereafter, whereby it is possible to avoid a state in which data of a whole memory block including the memory cell can no longer be read out correctly.

In accordance with another aspect of the present invention disclosed in this specification, there is provided a configuration of an electrically programmable and erasable non-volatile semiconductor memory such as a flash memory, wherein a flag is provided which notifies an external device of a power-supply cutoff in the course of an operation to write or erase information into or from memory cell employed in the memory in the event of such a power-supply cutoff. It is desirable to provide a function for outputting an address, which was accessed at a time the cutoff of the power supply occurred. By notifying the external device such as a host CPU of such information, the external device is capable of recovering data stored in an area of the memory, which has been damaged by the cutoff of the power supply.

In accordance with a further aspect of the present invention disclosed in this specification, there is provided a configuration of an electrically programmable and erasable non-volatile semiconductor memory such as a flash memory, wherein an operation currently being executed to write or erase information into or from a memory cell employed in the memory is discontinued and a write-back operation is carried out to change a threshold voltage of the memory cell in a direction of increasing the threshold voltage in the event of a power-supply cutoff in the course of the operation to write or erase information into or from the memory cell, whereas an internal power-supply circuit can be switched from one state to another in dependence on the level of a voltage generated by a power supply so as to allow the write-back operation to be carried out successfully. Typically, the internal power-supply circuit can be switched from one state to another by changing the number of charge-pump stages. Thus, since the internal power-supply circuit generates an operating voltage serving as a countermeasure for a decrease in power-supply voltage due to a cutoff of the power supply, the write-back operation can be carried out with a high degree of reliability even in the event of such a power-supply cutoff.

BRIEF DESCRIPTION OF THE DRAWINGS

FIG. 16($b$) shows timings of the clock signals, which are supplied to the circuit shown in FIG. 15 when the circuit is operating as a charge pump having (n−3) stages;

FIG. 16($c$) shows timings of the clock signals, which are supplied to the circuit shown in FIG. 15 when the circuit is operating as a charge pump having (n−5) stages;

FIG. 18($b$) shows timing charts of clock signals, which are supplied to the circuit shown in FIG. 17 when the circuit is operating as a charge pump having a stage count of 4;

FIG. 20($b$) shows timing charts of clock signals, which are supplied to the circuit shown in FIG. 19 when the circuit is operating as a charge pump having a stage count of 4;

DETAILED DESCRIPTION OF THE PREFERRED EMBODIMENTS

Preferred embodiments of the present invention are explained by referring to diagrams as follows.

Figure 1:
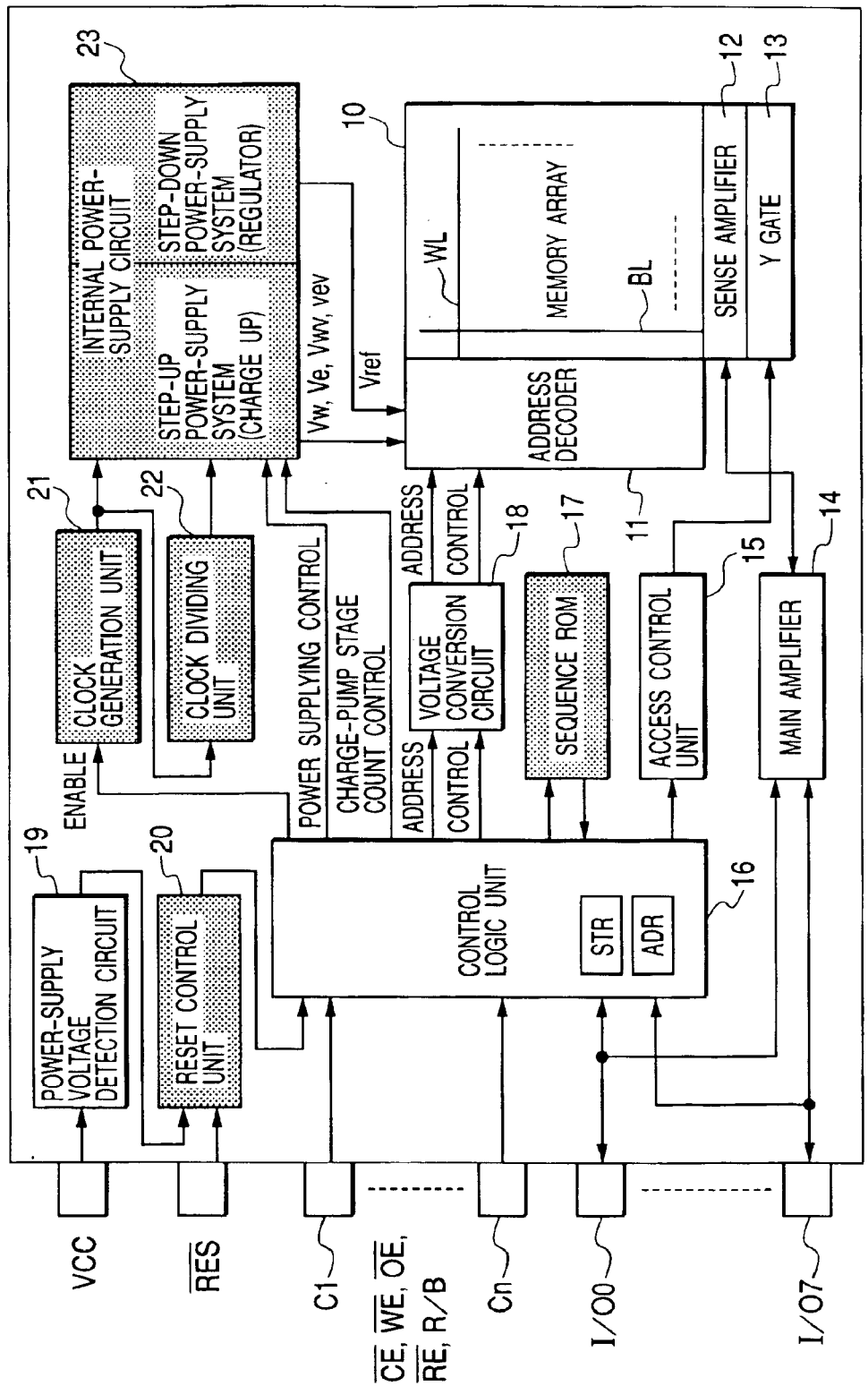
FIG. 1 is a block diagram showing an embodiment implementing a flash memory serving as a typical effective non-volatile semiconductor memory to which the present invention is applied.

FIG. 1 is a block diagram showing an embodiment implementing a flash memory used as a typical effective non-volatile semiconductor memory by application of the present invention. In general, a flash memory is a binary memory in which 1 memory cell can be used for storing 1 bit of data. However, the flash memory implemented by this embodiment is a tetranary (4-value) memory in which 1 memory cell can be used for storing 2 bits of data. This flash memory is formed on a semiconductor chip such as single crystal silicon.

Figure 2:
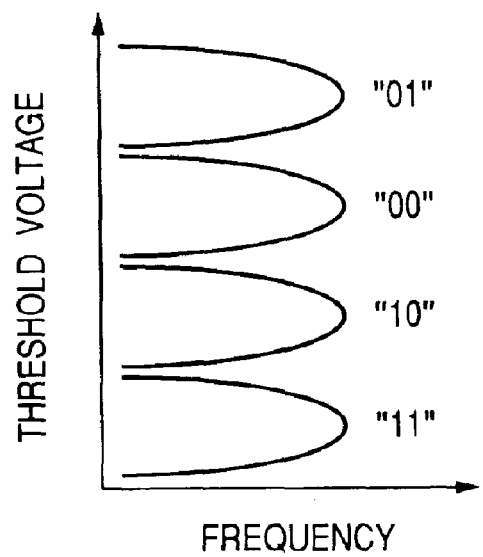
FIG. 2 is an explanatory diagram showing distributions of threshold voltages of memory cells employed in a flash memory implemented by an embodiment of the present invention.

In FIG. 1, reference numeral 10 denotes a memory area in which a plurality of non-volatile memory cells is laid out to form a matrix. Reference numeral 11 denotes an address decoder for decoding an address (X address) signal to select a word line WL in the memory area 10 and set the selected word line WL at a selected-state level. The address decoder 11 includes a word driver circuit for driving the word line WL to the selected-state level. Each of the memory cells composing the memory area 10 is a MOSFET having a floating gate and a control gate. In accordance with the amount of electric charge injected into the floating gate, the threshold voltage is set at one of 4 levels as shown in FIG. 2, allowing 2 bits of information to be stored in the memory cell.

In this embodiment, the state in which the threshold voltage is set at the highest level corresponds to a data value of "01". The state in which the threshold voltage is set at a level second to the highest level corresponds to a data value of "00". The state in which the threshold voltage is set at the third level from the highest level corresponds to a data value of "10". The state in which the threshold voltage is set at the lowest level corresponds to a data value of "11". However, this relation between the level of the threshold voltage and the value of the stored data is typical. It is to be noted that, in this embodiment, the state in which the threshold voltage is set at the lowest level is referred to as a state of erased data. That is, an operation to lower the threshold voltage is called an erase operation while an operation to raise the threshold voltage is called a write operation or a write back operation. In the case of the flash memory implemented by this embodiment, in an operation to overwrite data already stored in a memory cell of the memory area 10, the memory cell is once put in a state of erased data and then a write voltage is applied to the memory cell so as to set the threshold voltage of the memory cell at a level corresponding to the value of new data being stored in the memory cell.

In FIG. 1, reference numeral 12 denotes a sense amplifier connected to a bit line BL in the memory area 10. The sense amplifier 12 is a component for holding data read out from a memory cell through the bit line BL, amplifying a signal representing the data and latching the amplified signal. Reference numeral 13 denotes a Y gate (or a column switch) for selecting write data or read data in byte units among pieces of data to be written into or read out from a plurality of memory cells connected to 1 word line. Reference numeral 14 denotes a main amplifier for amplifying a data signal amplified by a sense amplifier 12 or a data signal coming from an external source to be written into a memory cell. Reference numeral 15 is an access control circuit for controlling the direction of a signal in the main amplifier 14 and controlling selection of a Y gate 13 on the basis of an address signal received from an external source or an address signal generated internally.

Reference numeral 16 denotes a control logic unit for generating an internal control signal in accordance with a command code received from an external source by way of input/output signals I/O0 to I/O7. Reference numeral 17 denotes a sequence ROM for storing the control sequence of the control logic unit 16 in the form known as a microprogram. The input/output signals I/O0 to I/O7 are used not only for passing through an input command as described above, but also for inputting data to be written into the memory area 10 and an address in the memory area 10 as well as outputting data read out from the memory area 10. In a write operation, data coming from an external source by way of the input/output terminals I/O0 to I/O7 to be stored into the memory area 10 is supplied to the memory area 10 through the main amplifier 14 and the sense amplifier 12. A write address is first supplied to the control logic unit 16 and then fed to a voltage conversion circuit 18 for converting a write voltage level of the address into another one before eventually being supplied to an address decoder 11. In actually, the voltage conversion unit 18 converts not only a level of a write address supplied by the control logic unit 16 to the address decoder 11 into another level, but also a write pulse width of the write address into another pulse width and a level of a control signal supplied by the control logic unit 16 to the address decoder 11 as a signal specifying the write voltage level of the write address into another level. The write pulse width is defined as a duration during which a write voltage is being applied.

The control logic unit 16 has a status register STR for storing a write check bit and an erase check bit. The a write check bit is a status bit indicating whether a write operation has ended successfully or ended in a failure whereas the erase check bit is a status bit indicating whether an erase operation has ended successfully or ended in a failure. The control logic unit 16 also includes an address register ADR for holding an address being currently accessed. The control logic unit 16 is implemented into a configuration allowing the contents of the status register STR and the address register ADR to be output to a destination outside the chip by way of the input/output terminals I/O0 to I/O7. In addition to the write check bit indicating a result of a write operation and the erase check bit indicating a result of an erase operation, the status register STR also includes a bit indicating internal control status of the chip and a bit serving as an operation check flag to be described later. The bit indicating the internal control status of the chip is referred to as an R/B bit. A value of "1" set in the R/B bit indicates that the chip is in an operating state so that the chip is not accessible to an external access maker. On the other hand, a value of "0" set in the R/B bit indicates that the inside of the chip is in a wait state so that the chip can be accessed by an external access maker.

Typically, the flash memory implemented by the embodiment also includes a power-supply voltage detection circuit 19, a reset control circuit 20, a clock generation circuit 21, a clock dividing unit 22 and an internal power-supply circuit 23 even though these components do not specially serve as restrictions to the embodiment. The power-supply voltage detection circuit 19 is a component for detecting the level of a power-supply voltage VCC. The reset control circuit 20 is a component for outputting internal reset signals such as a power-on reset signal and a power-supply cutoff reset signal to the control logic unit 16 on the basis of a starting detection signal, which is generated by the power-supply voltage detection circuit 19 as a signal detecting a starting of the power-supply voltage, and on the basis of a reset signal /RES received from an internal controller. The clock generation unit 21 is typically a ring oscillator for generating a clock signal. The clock dividing unit 22 is a component for dividing the frequency of the clock signal generated by the clock generation unit 21. Provided with members such as a charge pump and a voltage regulator, the internal power-supply circuit 23 is a component for generating high and low voltages required by the address decoder 11. The high voltages include a write voltage Vwv, an erase voltage and a verify voltage Vev whereas an example of the low voltage is a reference voltage Vref.

The flash memory implemented by this embodiment has a configuration in which, if the reset control circuit 20 outputs a signal to the control logic unit 16 to notify the control logic unit 16 of a power-supply cutoff on the basis of a reset signal /RES received from an external controller in the course of a write or erase operation carried out on a memory cell, the control logic unit 16 discontinues the operation currently being executed and performs a writeback process to raise the threshold voltage of the memory cell serving as the target of the operation.

In addition, the flash memory implemented by this embodiment also has control pins C1 to Cn for receiving control signals such as a chip select signal /CE, a write enable signal /WE, an output enable signal /OE and a read enable signal /RE. The control signals received by the control pins Cl to Cn are supplied to the control logic unit 16. Unless otherwise specified, the prefix '/' preceding the name of a signal indicates that the signal is an active-low signal. The control logic unit 16 outputs a ready/busy signal R/B to the outside of the chip. The ready/busy signal R/B indicates whether or not the chip is in a state allowing a command to be entered to the chip.

Figure 3:
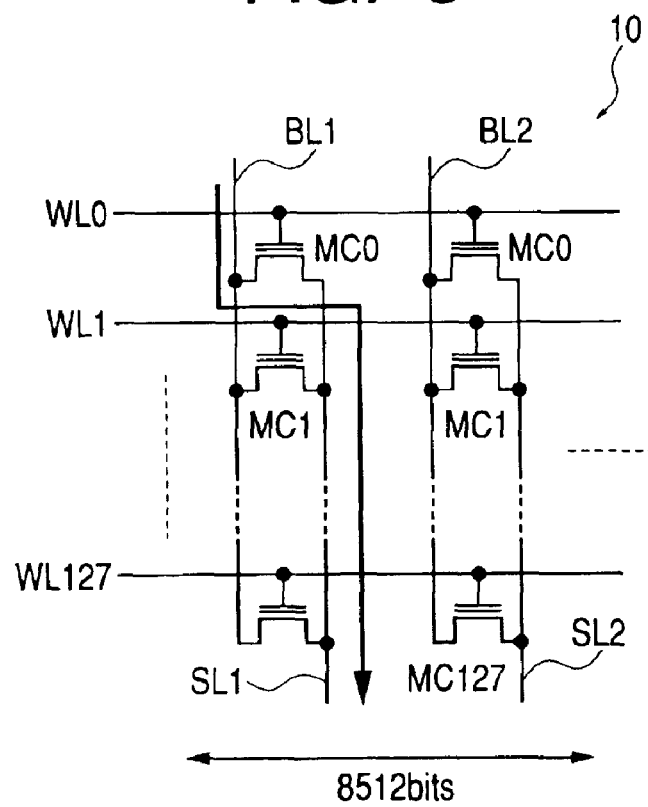
FIG. 3 is an explanatory diagram showing a typical circuit configuration of a memory array of a flash memory implemented by an embodiment of the present invention.

As shown in FIG. 3, the memory array of the flash memory implemented by the embodiment comprises typically 8,512 columns each including 128 memory cells MC0 to MC127, which are connected to each other in parallel by a pair of lines, namely, a bit line BLi and a source line SLi parallel to the bit line Bli, being laid out between the bit line BLi and the source line Sli, where i=1, 2 and so on. 8,512 memory cells MCi are thus laid out in the word-line (horizontal) direction along row i where i=0 to 127. In this specification, all these memory cells referred to as a memory block. The 8,512 memory cells MCi laid out in the word-line (horizontal) direction along row i are connected to a common word line WLi where i=0 to 127. In this specification, the group of 8,512 memory cells MCi laid out in the word-line (horizontal) direction along row i is referred to as a sector. The flash memory implemented by the embodiment has a configuration in which data is written and erased into and from the memory in sector units.

Figure 4:
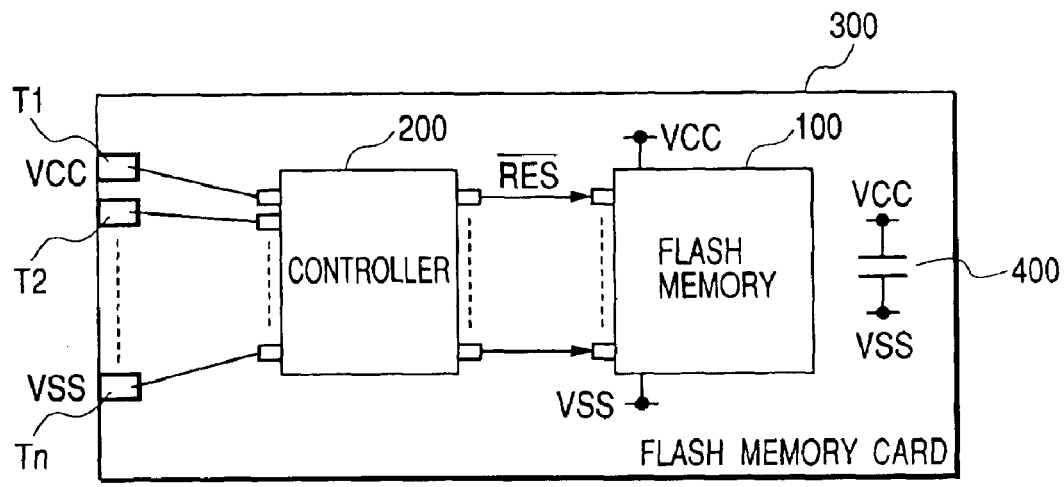
FIG. 4 is a block diagram showing a typical configuration of a memory card utilizing a flash memory implemented by an embodiment of the present invention.

By referring to FIG. 4, the following description explains a typical configuration of the flash memory implemented by the embodiment for a case in which the memory is used in a memory card.

As shown in FIG. 4, the memory card comprises a flash memory 100 and a controller LSI 200, which are enclosed in a package 300 made of typically ceramics. The controller LSI 200 is typically a microprocessor supplying commands and addresses to the flash memory 100.

The package 300 has power-supply terminals T1 and Tn to which power-supply voltages VCC and VSS are applied. The package 300 also has external-device terminals T2, T3 and so on connected to external devices. The power-supply terminals T1 and Tn are connected to power-supply pins of the controller LSI 200 and the flash memory 100 whereas the external-device terminals T2, T3 and so on are connected to their respective input/outputs pins of the controller LSI 200 by wires such as bonding wires or wires created on a printed-wire board. Control and I/O pins of the flash memory 100 are connected to their respective pins of the controller LSI 200 by wires such as wires created on a printed-wire board. A reset signal /RES is supplied from the controller LSI 200 to the flash memory 100.

The package 300 of the memory card implemented by this embodiment includes an embedded power-supply capacitor 400 having a capacitance of about 10 OF in addition to the flash memory 100 and the package 300. The power-supply capacitor 400 is connected between the power-supply terminals VCC and VSS to form a configuration in which, even if the power furnished by an external power supply is cut off, power is supplied from the power-supply capacitor 400 to the flash memory 100 for a little while. As an alternative, it is possible to provide another configuration in which the power-supply capacitor 400 is embedded in the flash memory 100, the controller LSI 200 or both. As another alternative, it is also possible to provide a further configuration in which the power-supply capacitor 400 is created on each of the semiconductor substrates of the flash memory 100 and the controller LSI 200.

Figure 5:
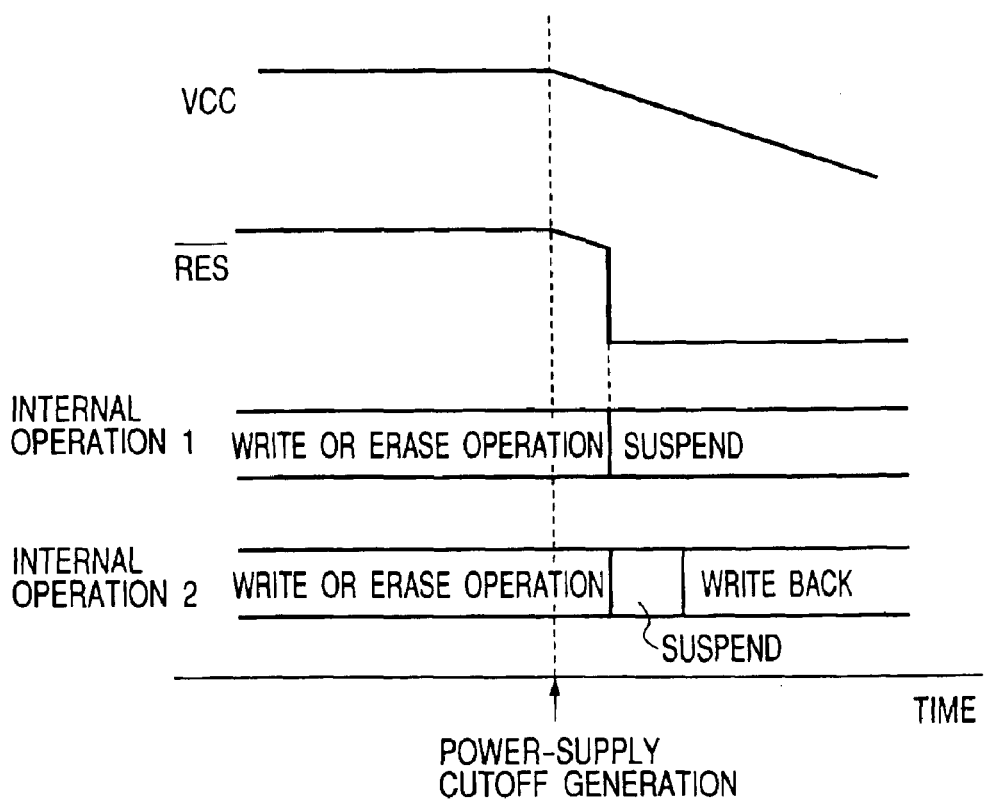
FIG. 5 depicts timing charts showing operation timings of erase and write operations carried out in a flash memory implemented by an embodiment of the present invention as well as operation timings of a process performed in the event of a power-supply cutoff in the course of an erase or write operation.
Figure 6:
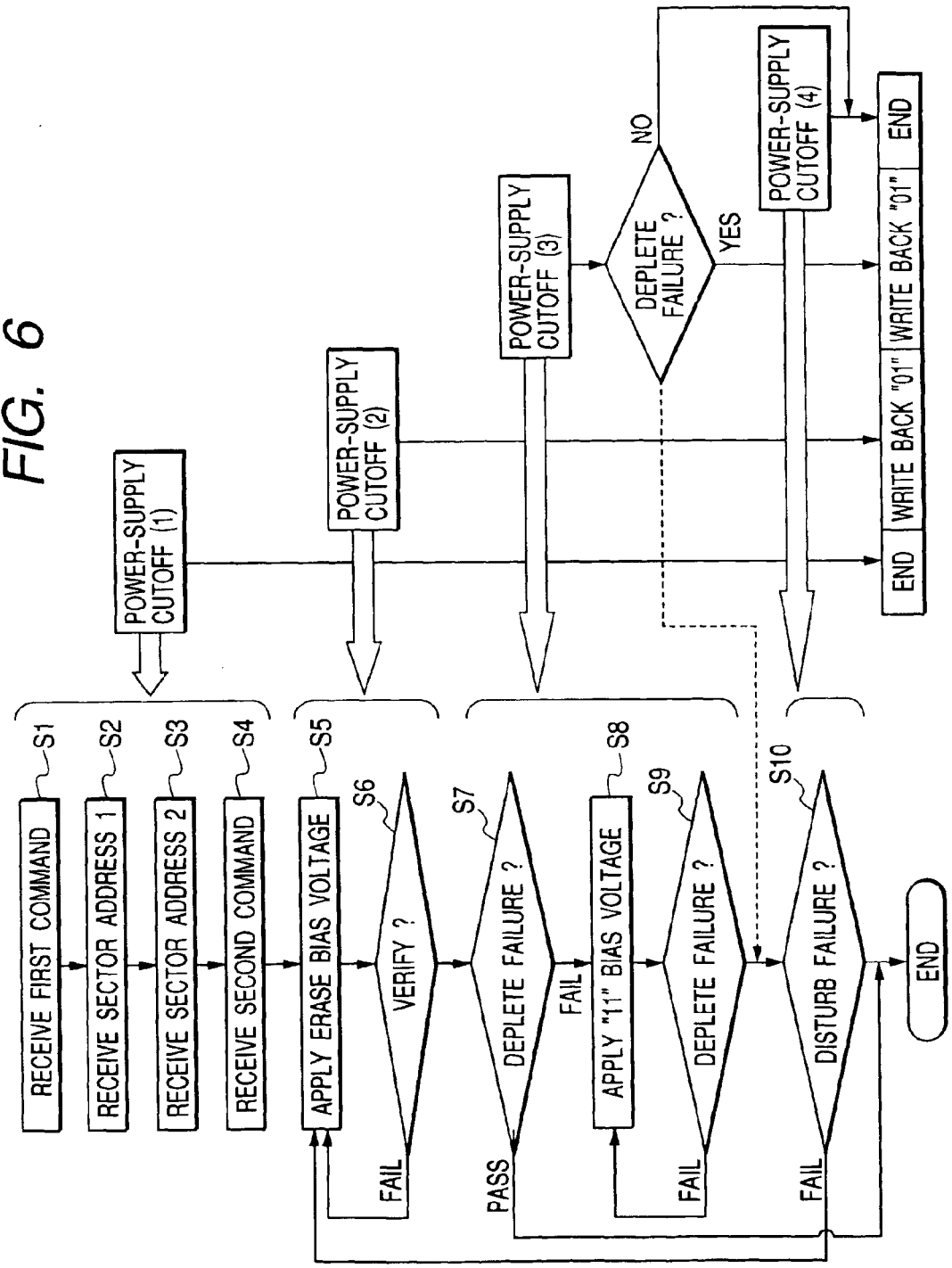
FIG. 6 shows a flowchart representing typical procedures of erase and write operations carried out in a flash memory implemented by an embodiment of the present invention as well as a typical procedure of a process performed in the event of a power-supply cutoff in the course of an erase or write operation.
Figure 7:
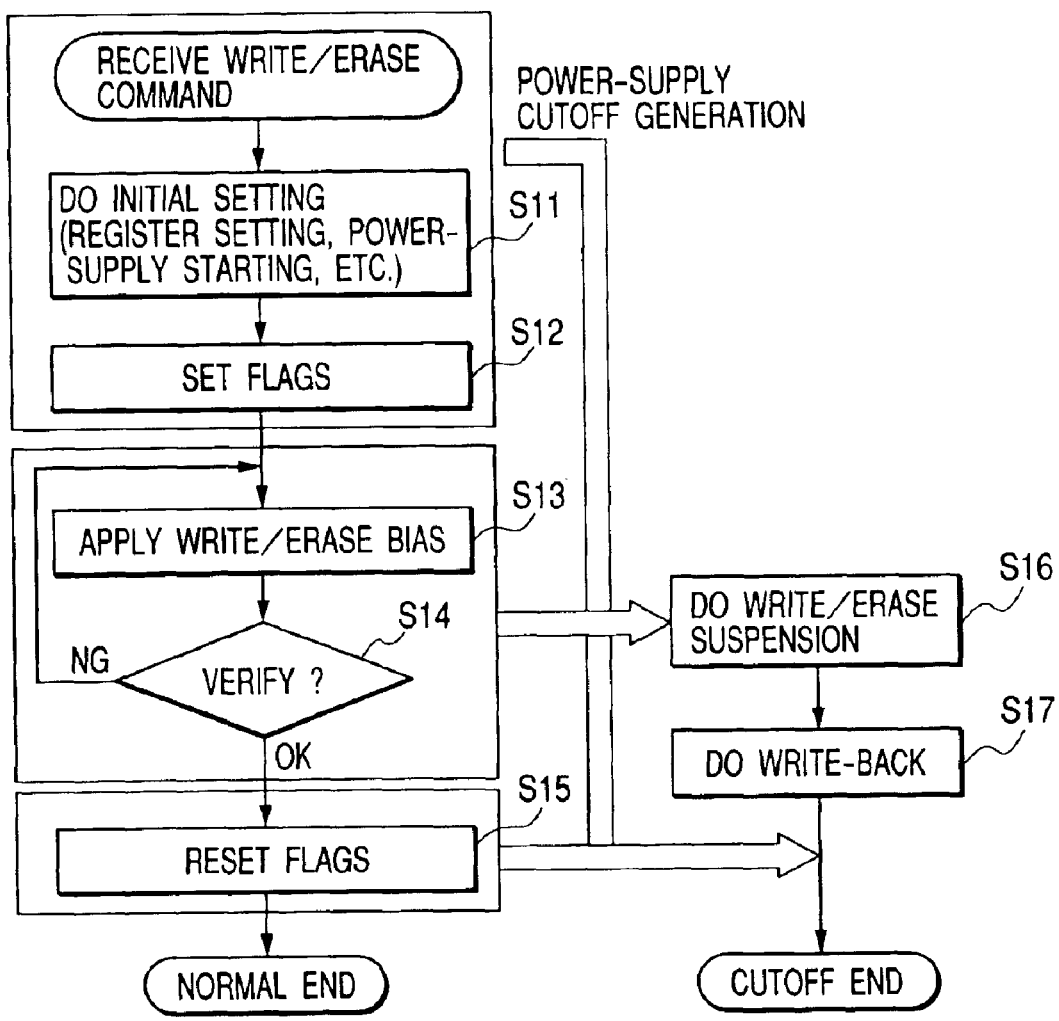
FIG. 7 shows a flowchart representing other typical procedures of erase and write operations carried out in a flash memory implemented by an embodiment of the present invention as well as another typical procedure of a process performed in the event of a power-supply cutoff in the course of an erase or write operation.

By referring to a timing chart shown in FIG. 5 and flowcharts shown in FIGS. 6 and 7, the following description explains a typical procedure of operations to erase and write data from and into the flash memory implemented by the embodiment and a typical procedure of processing to cope with a power-supply cutoff occurring in the course of the erase or write operation.

When the control logic unit 16 receives a first command making a request for a write operation as well as a high sector address SA1 and a low sector address SA2, which are attached to the first command, from a controller at steps S1 to S3, the control logic unit 16 generates signals such as a signal to activate the internal power-supply circuit 23 and a signal output to the voltage conversion unit 18 to specify a voltage in making a preparation of an erase operation. Afterward, when a second command to start the erase operation is received from the controller at a step S4, a predetermined erase voltage is applied to memory cells specified by the input addresses at a step 5S to start the erase operation. Then, at the next step S6, the success of the erase operation is verified by examining the levels of the threshold voltages of the memory cells to determine whether or not the threshold voltages have been reduced to a sufficiently low level. If the threshold voltages have not been reduced to a sufficiently low level, the flow of the procedure goes back to the step S5 to again apply the erase voltage to the memory cells.

If the threshold voltages of all the memory cells specified by the input addresses have been reduced to a predetermined level or a level lower than the predetermined level, on the other hand, the flow of the procedure goes on to a step S7 to determine whether or not a depletion state exists, that is, whether or not there is a memory cell having a threshold voltage equal to or lower than 0 V. If no memory cell is in a depletion state, the erase operation is ended. If a memory cell is in a depletion state, on the other hand, the flow of the procedure goes on to a step S8 at which a bias voltage is applied to the memory cell having an excessively low threshold voltage to slightly raise the threshold voltage of the memory cell.

Then, the flow of the procedure goes on to a step S9 at which a verification is carried out by applying a bias voltage to assure that there is no longer a memory cell in a deplete state. The bias voltage is applied repeatedly till there is no longer a memory cell in a deplete state. As deplete-failure bits are eliminated, the flow of the procedure goes on to a step S10 to determine whether or not there is a memory cell in a state of being disturbed, that is, whether or not there is a memory cell with the threshold voltage thereof raised excessively. If there is a memory cell with the threshold voltage thereof raised excessively, the flow of the procedure goes back to a step S5 to apply voltage for lowering the threshold voltage of the memory cell to the memory cell. As all the memory cells are verified to have their threshold voltages brought to levels in a predetermined range, the erase operation is ended.

If the flash memory implemented by this embodiment receives a reset signal /RES, which indicates that power-supply cutoff 1 has occurred in the course of processing carried out at the steps S1 to S4 of receiving the first and second commands respectively, from the controller, the execution of the erase operation is ended immediately. If the flash memory receives a reset signal /RES, which indicates that power-supply cutoff 2 has occurred in the course of processing carried out at the steps S5 and S6 of applying a bias voltage to erase data from memory cells and verifying the success the erase operation respectively, from the controller, a write-back operation is carried out to apply a write voltage for raising the threshold voltages of memory cells each serving as a target of the erase operation to the highest threshold level for the data "01".

If the flash memory receives a reset signal /RES, which indicates that power-supply cutoff 3 has occurred in the course of processing carried out at the steps S7 to S9 of checking the existence of a deplete state and carrying out a write-back operation against memory cells in a deplete state, from the controller, the write-back operation is ended. Then, the memory cells are examined to determine whether or not there are memory cells in a deplete state. If there are no memory cells in a deplete state, the execution of the erase operation is ended immediately. If there are memory cells in a deplete state, on the other hand, a write-back operation is carried out to apply a write voltage for raising the threshold voltages of the memory cells to the highest threshold level for the data "01". It is to be noted that, if there are no memory cells in a deplete state, the flow of the procedure can be continued to the step S10 as indicated by a dashed line. This is because the processing to continue the flow of the procedure to the step S10 can be completed in a short period of time.

If the flash memory receives a reset signal /RES, which indicates that power-supply cutoff 4 has occurred in the course of processing carried out at the step S10 of checking the existence of a disturbed state, from the controller, the execution of the erase operation is ended immediately.

It is necessary to design a configuration in which the write-back operation carried out after a cutoff of the power supply as described above is ended before electric charge accumulated in the power-supply capacitor 400 is all discharged. In other words, the capacitance of the power-supply capacitor 400 is set at a value allowing the write-back operation to be carried out after a cutoff of the power supply with a high degree of reliability.

The erase operation has been explained so far. A write operation can be represented by all but the same flowchart as that shown in FIG. 6. However, the write operation is different from the erase operation in that, in the case of the write operation, write commands in place of erase commands are received at the steps S1 as well as S2 and, after the step S9, a bias voltage for raising the threshold voltage to a desired level corresponding to data being written is applied and a verify operation is carried out.

By the way, the flowchart shown in FIG. 6 is designed on the assumption that the control logic unit 16 knows what state the inside of the flash memory is in when the flash memory receives a reset signal /RES indicating a cutoff of the power supply from the controller.

FIG. 7 is a diagram showing an embodiment implementing a flowchart, according to which the control logic unit 16 is capable of easily determining what state the inside of the flash memory is in. At a point of time preparatory operations carried out at an initial setting step S11 after receiving the first command are completed, the flow of the procedure goes on to a step S12 at which an operation check flag is set. Then, at the next step S13, a bias voltage for the write or erase operation is applied. At a point of time a final verify operation carried out at a step S14 is completed, the flow of the procedure goes on to a step S15 at which processing to reset the operation check flag is carried out.

By carrying out processing to set and reset the operation check flag as described above, the control logic unit 16 is capable of easily determining what state the inside of the flash memory is in when the flash memory receives a reset signal /RES indicating a cutoff of the power supply from the controller. To put it concretely, if the flash memory receives a reset signal /RES indicating the existence of a power-supply cutoff from the controller before the operation check flag is set or after the operation check flag is reset, the execution of the write or erase operation is ended immediately. If the flash memory receives a reset signal /RES indicating the existence of a power-supply cutoff from the controller after the operation check flag is set but before the operation check flag is reset, on the other hand, the flow of the procedure goes on to a step S16 at which the write or erase operation is discontinued. Then, at the next step S17, a write-back operation is carried out to raise the threshold voltage before the execution of the write or erase operation is ended.

It is to be noted that the flowchart shown in FIG. 7 is the same flowchart as that shown in FIG. 6 except that some portions thereof are simplified. To put it concretely, the step S11 of the flowchart shown in FIG. 7 corresponds to the steps S1 to S4 of the flowchart shown in FIG. 6, the step S13 of the flowchart shown in FIG. 7 corresponds to the steps S5 and S8 of the flowchart shown in FIG. 6 and the step S14 of the flowchart shown in FIG. 7 corresponds to the steps S6, S7 and S9 of the flowchart shown in FIG. 6. Typically, an unused bit of the status register STR can serve as the operation check flag described above. As an alternative, a non-volatile storage device can be used as the operation check flag so that the value of the flag can be sustained therein even if the power supply is completely cut off. In addition, power-supply cutoff flags can be provided separately from the operation check flag. As will be described below, the power-supply cutoff flags are flags each indicating whether or not a power-supply cutoff has occurred in the course of a write or erase operation. The value of each power-supply cutoff flag is sustained even after the cutoff of the power supply.

Figure 8:
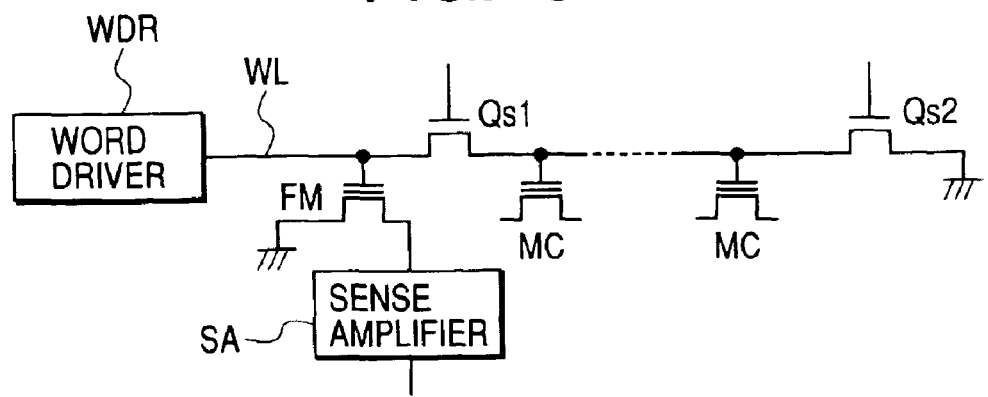
FIG. 8 is an explanatory diagram showing a typical configuration including a power-supply cutoff flag in a flash memory implemented by an embodiment of the present invention.

A typical configuration of power-supply cutoff flags provided for the non-volatile memory is explained by referring to FIGS. 8 to 11. FIG. 8 is a diagram showing a power-supply cutoff flag provided for each word line so as to allow the sector associated with the world line to be identified as a sector, which has served as a target of a write or erase operation in the event of a power-supply cutoff. In FIG. 8, symbol MC denotes a non-volatile memory cell, symbol WL denotes a word line and symbol WDR denotes a word driver provided in the address decoder 11 shown in FIG. 11 to serve as an element for driving the word line WL to a selected-state level. As shown in FIG. 8, in this embodiment, the word line WL is connected to the control gate of a non-volatile storage device serving as a flag memory FM, the drain terminal of which is connected to a sense amplifier SA. The world line WL is also connected to switch MOSFETs Qs1 and Qs2.

Typically, the flag memory FM is set in advance in a state of erased data corresponding to a low threshold voltage in an initial setting operation. In the event of a power-supply cutoff, the sense amplifier SA is set to "1" and, by applying a high voltage to the word line WL, the threshold voltage can be raised to put the flag memory FM in a set state. In an operation to write data into the flag memory FM to set the flag memory FM, the switch MOSFET Qs1 is turned off while the switch MOSFET Qs2 is turned on so as to prevent the memory cells MC of the memory array from being affected by the write operation.

Data can be read out from the flag memory FM by adoption a pre-charge technique in the same way as the storage devices composing the memory array. Since the threshold voltage of each storage device composing the memory array can be set at one of 4 stages allowing 2-bit information to be stored in the storage device, however, in an operation to read out the information from the storage device, a read level at one of 3 stages is asserted on a world line WL connected to the storage device. In an operation to read out information from the flag memory FM, on the other hand, the word line WL connected to the flag memory FM is set at a predetermined read level so that it is possible to recognize the binary value of the information by adoption of a simple recognition technique of determining whether or not a current flows.

In this embodiment, the number of flags is large. However, the embodiment offers a merit that it is possible to easily determine whether or not a sector has served as a target of a write or erase operation in the event of a power-supply cutoff. It is possible to provide a configuration in which an operation to reset a flag memory FM, that is, an operation to erase information from the flag memory FM, can be carried out at the same time as an operation to erase information in block units from memory cells composing the memory array.

Figure 9:
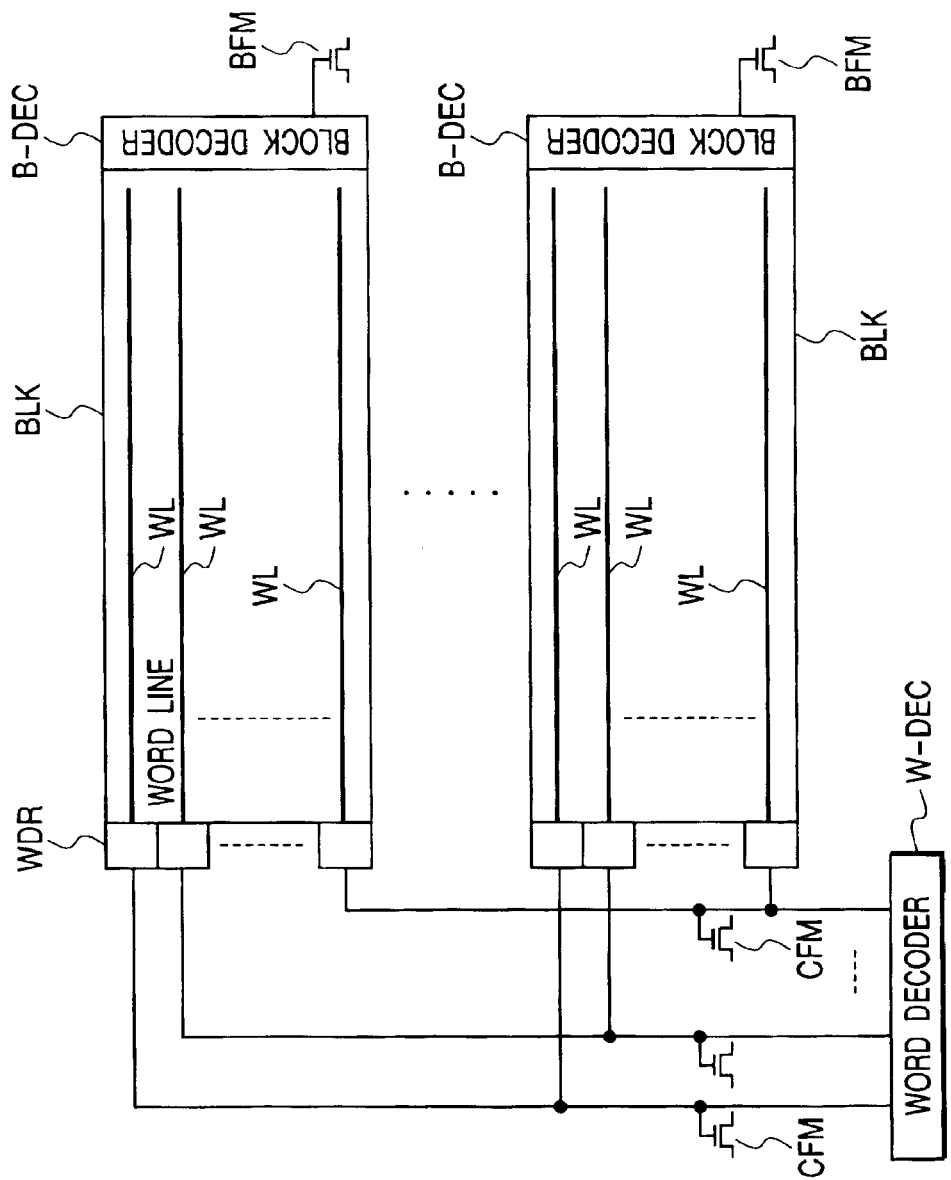
FIG. 9 is an explanatory diagram showing another typical configuration including a power-supply cutoff flag in a flash memory implemented by an embodiment of the present invention.

FIG. 9 is a diagram showing a configuration in which power-supply cutoff flags BFM and power-supply cutoff flags CFM are provided in a memory array adopting a hierarchical decoding technique to decode an address. The power-supply cutoff flags BFM are each provided for a block of the memory array and each of the power-supply cutoff flags CFM is provided for a specific word line in every block to serve as a flag common to the specific word lines of all blocks composing the memory array. It is thus easy to recognize a sector that has served as a target of a write or erase operation in the event of a power-supply cutoff. In FIG. 9, symbol BLK denotes a memory block comprising a predetermined number of memory-cell columns laid out in the word-line direction. The number of memory-cell columns laid out in the word-line direction is typically 8,512. Memory cells in each of the memory-cell columns are connected to each other in parallel by a pair of bit and source lines. Symbol WL denotes a word line and symbol WDR denotes a word driver for driving a word line WL to a selected-state level. Symbol W-DEC denotes a word decoder for selecting a word driver WDR for driving a word line WL in every block. Symbol B-DEC denotes a block decoder for selecting a block including memory cells each to serve as a target of a write or erase operation. The drain terminal of each of the power-supply cutoff flags BFM and CFM is connected to a sense amplifier not shown in the figure so that information can be written into and read out from the power-supply cutoff flags BFM and CFM.

In this embodiment, by referring to the power-supply cutoff flags BFM and CFM, it is possible to recognize a sector that has served as a target of a write or erase operation in the event of a power-supply cutoff. In addition, the present embodiment offers a merit that the number of flags is smaller than the number of flags employed in the embodiment shown in FIG. 8 but the present embodiment yet functions as well.

Figure 10:
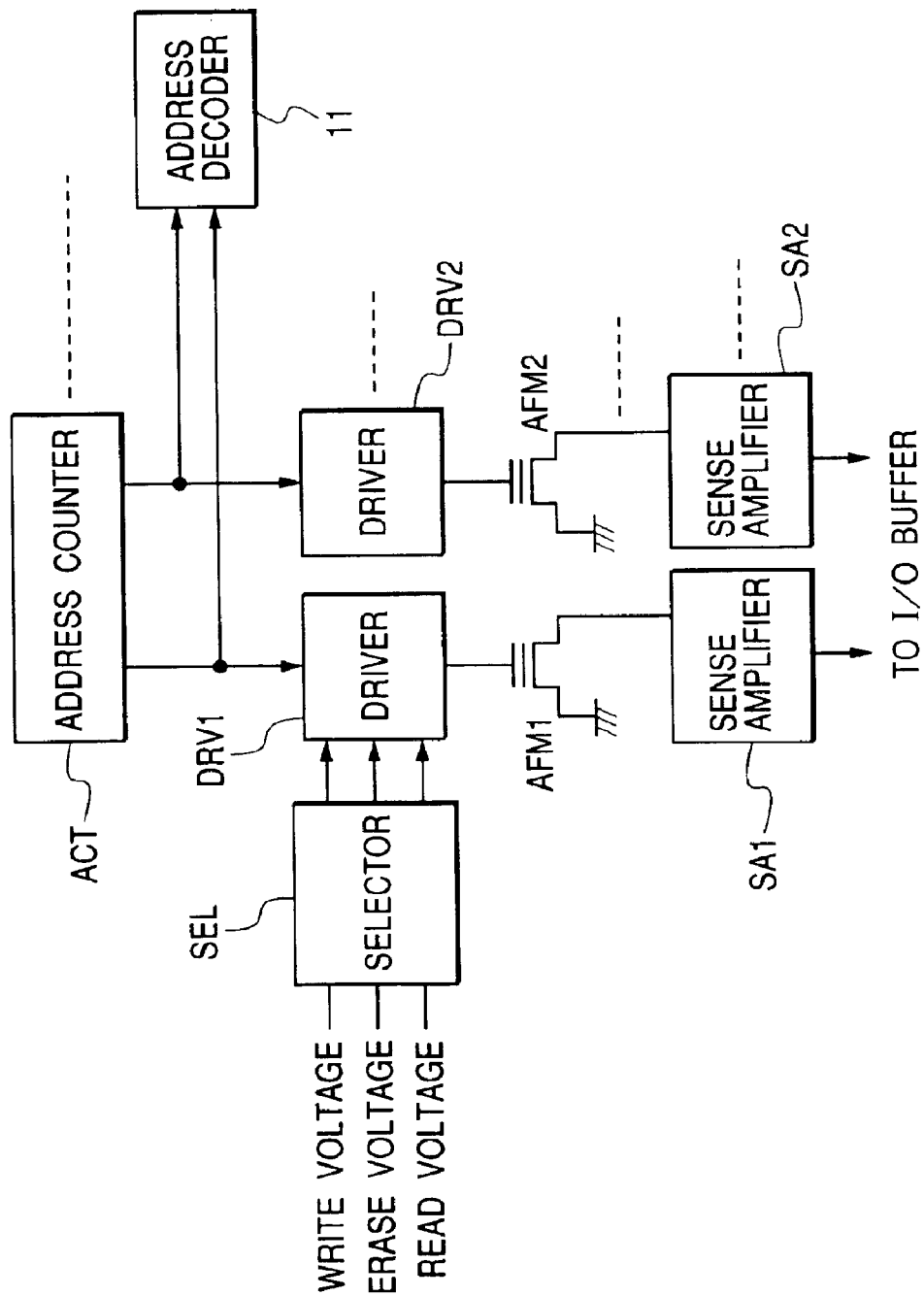
FIG. 10 is an explanatory diagram showing a typical configuration including flags for storing an address accessed in the event of a power-supply cutoff in a flash memory implemented by an embodiment of the present invention.

An embodiment shown in FIG. 10 employs flag memories AFM for storing the address of a sector that has served as a target of a write or erase operation in the event of a power-supply cutoff. In FIG. 10, symbol ACT denotes an address counter provided in the control logic unit 16 shown in FIG. 1 and reference numeral 11 denotes an address decoder for decoding an address signal to select a word line in the memory array. This embodiment comprises flag memories AFM1, AFM2 and so on, drivers DRV1, DRV2 and so on, sense amplifiers SA1, SA2 and so on and a selector SEL. The flag memories AFM1, AFM2 and so on are used for storing an address. The drivers DRV1, DRV2 and so on generate voltages applied to the gate terminals of the flag memories AFM1, AFM2 and so on respectively. The sense amplifiers SA1, SA2 and so on are connected to the drain terminals of the flag memories AFM1, AFM2 and so on respectively. The selector SEL supplies an erase, write or read voltage, which is selected in dependence on the operating mode, to each of the drivers DRV1, DRV2 and so on. As many flag memories AFM1, AFM2 and so on, as many drivers DRV1, DRV2 and so on and as many sense amplifiers SA1, SA2 and so on as bits composing an address are provided in the embodiment.

This embodiment offers a merit of a much smaller number of flag memories in comparison with the embodiments shown in FIGS. 8 and 9. It is to be noted that, even though an address can be set in the flag memories AFM1, AFM2 and so on every time a write or erase operation is carried out, an address can be set therein only in the event of a power-supply cutoff.

Figure 11:
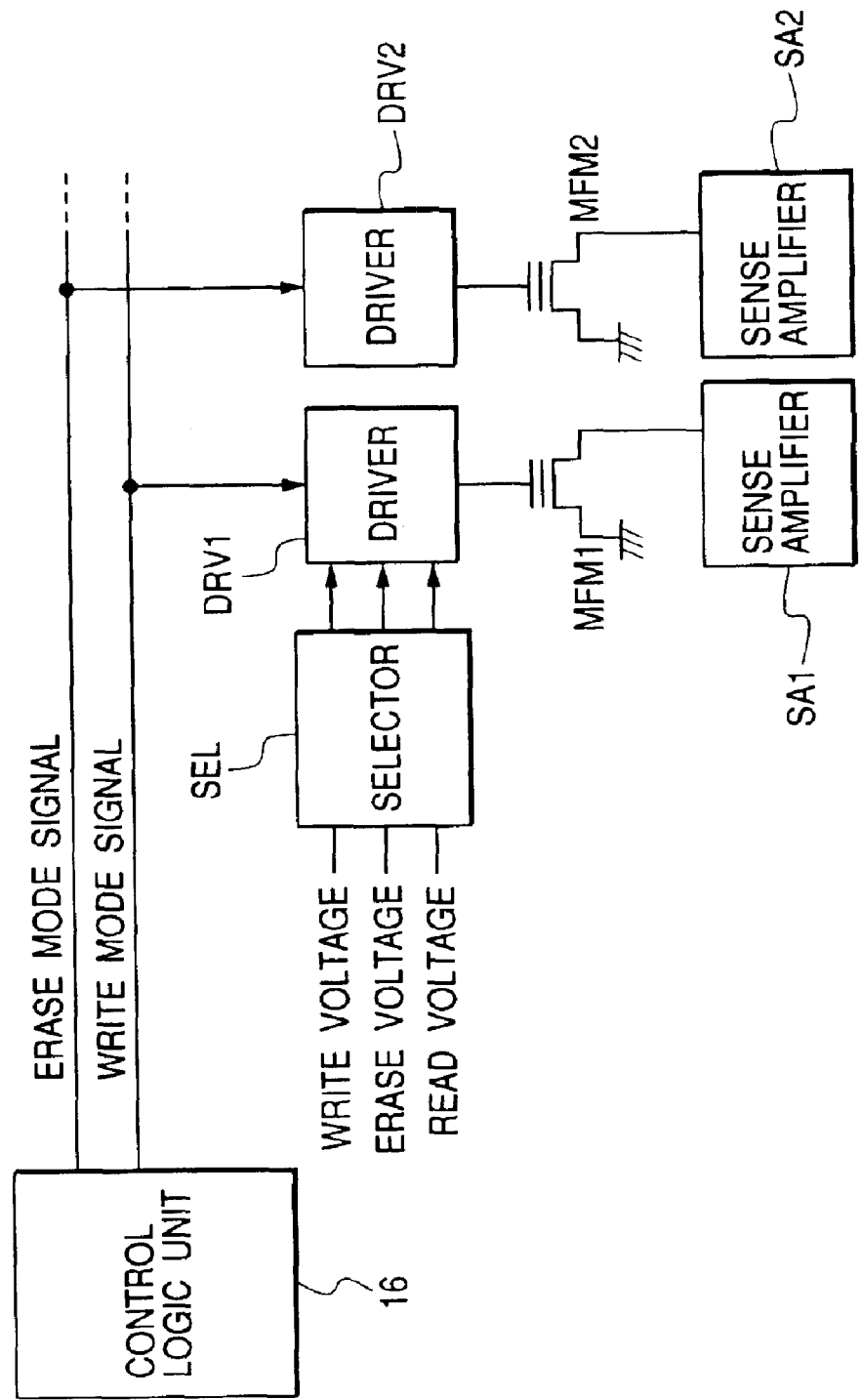
FIG. 11 is an explanatory diagram showing a typical configuration including flags for storing an operating state prevailing in the event of a power-supply cutoff in a flash memory implemented by an embodiment of the present invention.

FIG. 11 is a diagram showing an embodiment employing mode flag memories MFM1 and MFM2 for storing operating-mode information indicating whether the operating mode prevailing in the event of a power-supply cutoff in a write or erase operation was a write mode or an erase mode. This embodiment also includes drivers DRV1 and DRV2, sense amplifiers SA1 and SA2 and a selector SEL. The drivers DRV1 and DRV2 output mode signals representing an operating mode to the gate terminals of the mode flag memories MFM1 and MFM2 respectively. The sense amplifiers SA1 and SA2 are connected to the drain terminals of the mode flag memories MFM1 and MFM2 respectively. The selector SEL supplies an erase, write or read voltage, which is selected in dependence on the operating mode, to each of the drivers DRV1 and DRV2.

This embodiment offers a merit of an even smaller number of flag memories in comparison with the embodiment shown in FIG. 10. It is to be noted that, even though an operating mode can be set in the flag memories AFM1, AFM2 and so on every time a write or erase operation is carried out, an operating mode can be set therein only in the event of a power-supply cutoff. In addition, the embodiment shown in FIG. 11 offers another merit that the embodiment can be applied in conjunction with any of the embodiments shown in FIGS. 8 to 10.

Figure 12:
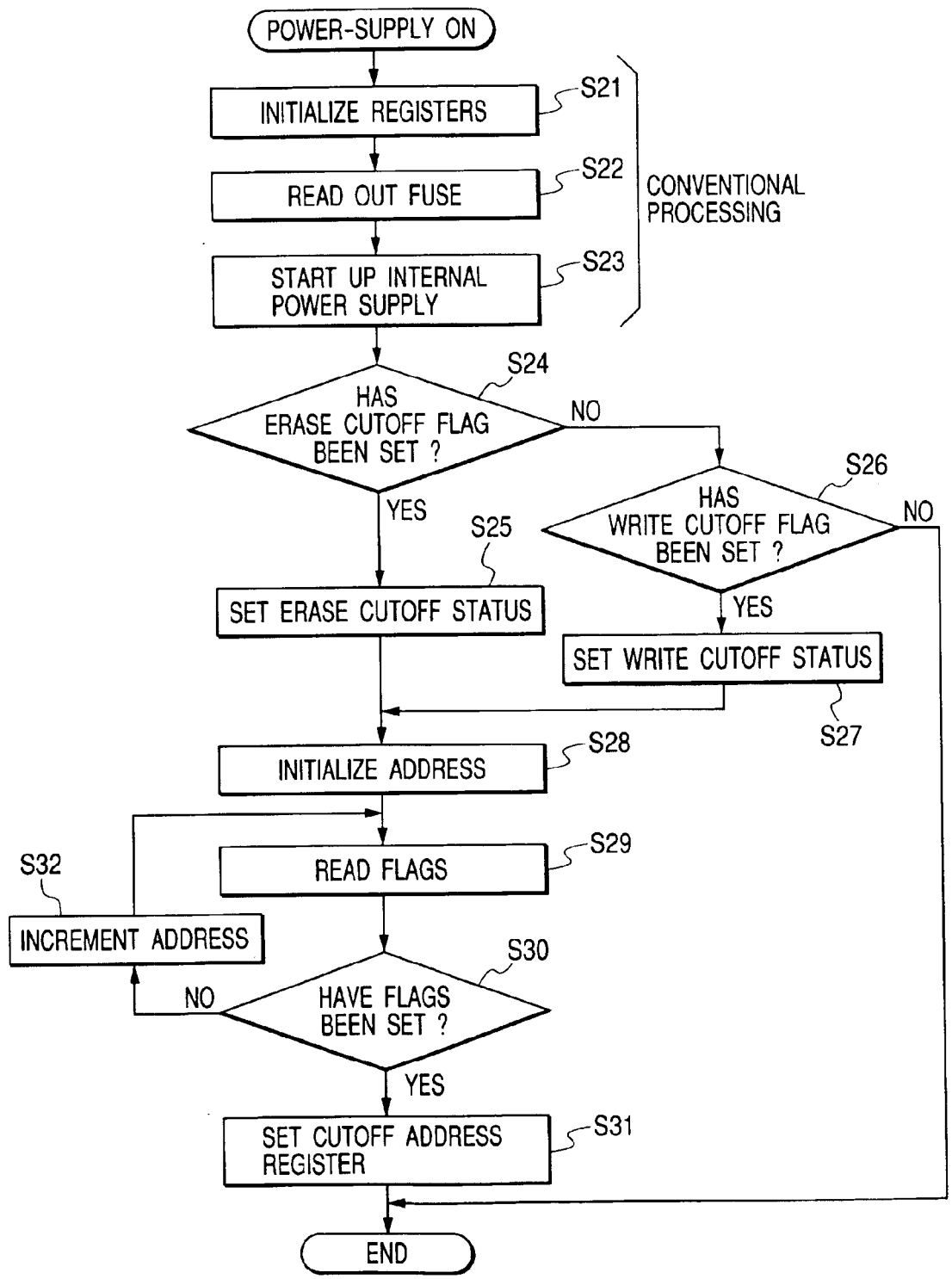
FIG. 12 shows a flowchart representing a typical procedure of a flag search process carried out in the event of a power-supply cutoff in a flash memory implemented by an embodiment of the present invention.

By referring to a flowchart shown in FIG. 12, the following description explains a typical technique to read a flag for a case in which the embodiment shown in FIG. 8 or 9 is used in conjunction with the embodiment shown in FIG. 11.

When the power supply is turned on, the control logic unit 16 initializes a variety of registers in the chip at a step S21. Then, at the next step S22, fuse status representing timings and setting of the power supply is read out from a fuse circuit. Subsequently, at the next step S23, an activation signal is supplied to the internal power-supply circuit 23 to activate the internal power-supply circuit 23. The operations carried out so far are the same as those carried out in the conventional flash memory.

In this embodiment, after the internal power-supply circuit 23 is activated, the control logic unit 16 starts a flag search process. The flag search process begins with a step S24 at which the control logic unit 16 examines the erase cutoff flag MFM2 to determine whether or not the erase cutoff flag MFM2 has been set. If the erase cutoff flag MFM2 has not been set, the flow of the procedure goes on a step S26 at which the control logic unit 16 examines the write cutoff flag MFM1 to determine whether or not the write cutoff flag MFM1 has been set. If the write cutoff flag MFM1 has not been set either, the execution of the flag search process is ended without doing anything. If the erase cutoff flag MFM2 has been set, on the other hand, the flow of the procedure goes on a step S25 at which an appropriate bit of the status register STR is set to indicate that a cutoff of the power supply has occurred in the course of an erase operation. Similarly, if the write cutoff flag MFM1 has been set, on the other hand, the flow of the procedure goes on a step S27 at which an appropriate bit of the status register STR is set to indicate that a cutoff of the power supply has occurred in the course of a write operation.

Then, at the next step S28, the address counter is initialized to all zeros, which are supplied to the address decoder as a start address. Subsequently, at the next step S29, information is read out from the flag memory FM. The flow of the procedure then goes on to a step S30 to determine whether or not the information read out from the flag memory FM indicates that the flag memory FM has been set. If the flag memory FM has been set, the flow of the procedure goes on to a step S31 at which the value of the address counter is stored in the address register ADR as a cutoff address. Then, the execution of the procedure is ended. If the determination result obtained at the step S30 indicates that the flag memory FM has not been set, on the other hand, the flow of the procedure goes on to a step S32 at which the address counter is incremented by 1. Then, the flow of the procedure goes back to the step S29 at which information is read out from the flag memory FM for the next address (that is, the address of the next sector). The operations of the steps S29, S30 and S32 are carried out repeatedly till a set flag is detected.

Figure 13:
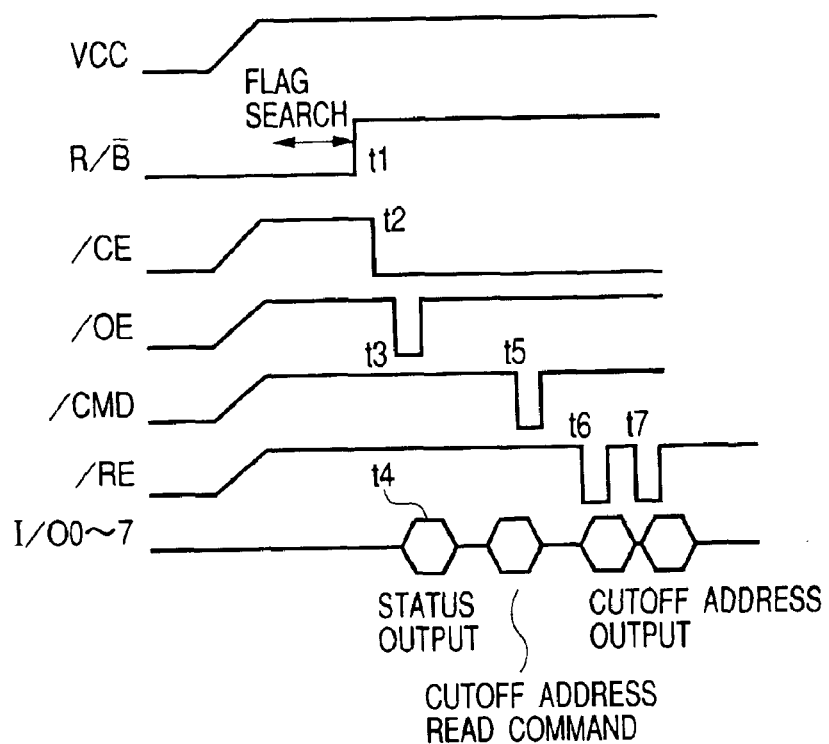
FIG. 13 depicts timing charts showing typical timings of an operation carried out at a power-on time by an external device to read out an address accessed in the event of a power-supply cutoff in a flash memory implemented by an embodiment of the present invention.
Figure 14:
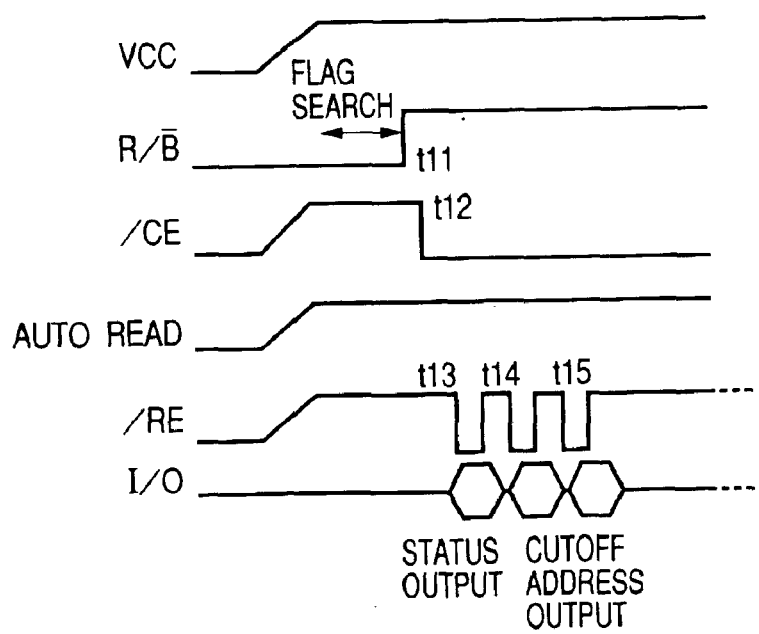
FIG. 14 depicts timing charts showing other typical timings of an operation carried out at a power-on time by an external device to read out an address accessed in the event of a power-supply cutoff in a flash memory implemented by an embodiment of the present invention.

FIGS. 13 and 14 each show a typical timing chart indicating timings to read out data from a flash memory allowing an external controller to read out a cutoff address, which has been stored in the address register ADR in accordance with the flowchart described above.

FIG. 13 shows timings for a configuration in which the controller issues a predetermined command to read out a cutoff address to the flash memory.

When the power supply is turned on, the flash memory carries out an initial-setting process and a flag search process. At the end of these processes, a ready/busy signal R/B is set to a high level indicating a ready state with a timing t1. When the controller detects the ready state, the controller puts the chip enable signal /CE to a low level with a timing t2 and the output enable signal /OE to the low level with a timing t3. As the chip enable signal /CE and the output enable signal /OE are brought to the low level, the contents of the status register STR are output to the input/output pins I/O0 to I/O7 with a timing t4. Thereafter, with a timing t5, the controller changes the command enable signal /CMD to a low level and supplies a cutoff-address read command to the input/output pins I/O0 to I/O7. Then, with a timing t6, the controller puts the read enable signal /RE to a low level before being restored back to a high level in an alternating manner to read out the first 8 bits of a cutoff address from the input/output pins I/O0 to I/O7. Later on, with a timing t7, the controller again puts the read enable signal /RE to a low level before being restored back to a high level in an alternating manner to read out the second 8 bits of the cutoff address from the input/output pins I/O0 to I/O7. In this way, the cutoff address having a typical width of 16 bits is read out from the address register ADR.

FIG. 14 shows timings for a configuration in which the controller supplies a control signal to a predetermined external terminal provided on the flash memory in order to read out a cutoff address from the address register ADR.

When the power supply is turned on, the flash memory carries out an initial-setting process and a flag search process. At the end of these processes, a ready/busy signal R/B is set to a high level indicating a ready state with a timing t11. At the same time as the operation to turn on the power supply, the controller firmly sets the predetermined external terminal referred to as an auto-read terminal provided on the flash memory at a high level and, upon detection of the change of the ready/busy signal R/B from a low level to the high level, the controller puts the chip enable signal /CE to a low level with a timing t12. Then, with a timing t13, the controller puts the read enable signal /RE to a low level before being restored back to a high level in an alternating manner to read out 8 bits of status from the input/output pins I/O0 to I/O7. In this way, the status having a typical width of 8 bits is read out from the status register STR. Subsequently, with a timing t14, the controller puts the read enable signal /RE to a low level before being restored back to a high level in an alternating manner to read out the first 8 bits of a cutoff address from the input/output pins I/O0 to I/O7. Later on, with a timing t15, the controller again puts the read enable signal /RE to a low level before being restored back to a high level in an alternating manner to read out the second 8 bits of the cutoff address from the input/output pins I/O0 to I/O7. In this way, the cutoff address having a typical width of 16 bits is read out from the address register ADR. As a result, at a power-on time, the cutoff address is read out automatically.

In addition, it is possible to design the flash memory into a configuration in which the internal power-supply circuit 23 operates in accordance with the level of a power-supply voltage supplied from an external power-supply voltage generator.

Figure 15:
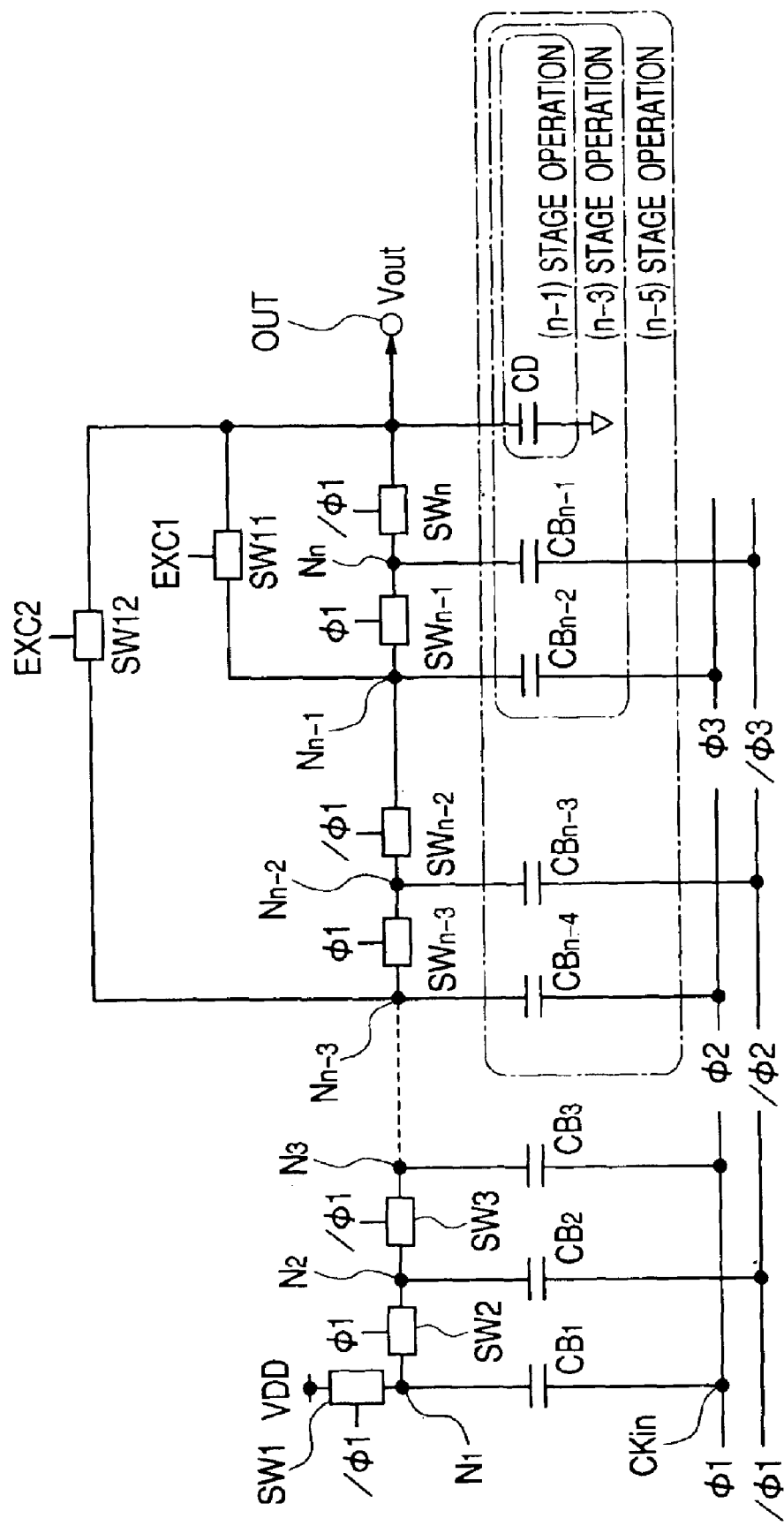
FIG. 15 is a circuit diagram showing an embodiment implementing a charge pump composing an internal power-supply circuit.

FIG. 15 is a diagram showing an embodiment implementing a charge pump composing the internal power-supply circuit 23. The charge pump implemented by this embodiment comprises switches SW1 to SWn and capacitors CB1 to CBn. The switch SW1 and the capacitor CB1 are connected to each other in series between a power-supply voltage terminal Vcc and a clock input terminal Ckin. The remaining (n−1) switches, namely, the switches SW2 to SWn, are connected in series between an output terminal OUT and a connection node N1, which is a node between the switch SW1 and the capacitor CB1. One terminal of the capacitor CBm is connected to a node Nm between the switches SWm and SWm+1 in parallel to the capacitor CB1 where m=2 to (n−1). One of clock signals $\phi1$, $\phi2$ and $\phi3$ having the same phase is supplied to the other terminal of the capacitor CBm connected to the node Nm, where m is an odd number representing the integers 1, 3 - - - and n−2. One of clock signals /$\phi1$, /$\phi2$ and /$\phi3$ each having a phase opposite to the phase of the clock signals $\phi1$, $\phi2$ and $\phi3$ is supplied to the other terminal of the capacitor CBm connected to the node Nm, where m is an even number representing the integers 2, 4 - - - and n−1.

The switch SWm where m is an odd number representing the integers 1, 3 - - - and n−1 is turned on and off by the clock signal φ1. On the other hand, the switch SWm where m is an even number representing the integers 2, 4 - - - and n is turned on and off by the clock signal /φ1. Thus, an electric charge accumulated in the capacitor CB1 by way of the switch SW1 is transferred to the capacitor CB2 by way of the switch SW2 then to the capacitor CB3 by way of the switch SW3 and so on sequentially in the direction from the left to the right and, finally, to the capacitor CBn–1 by way of the switch SWn–1 in a voltage-raising operation. The described configuration of the charge pump is all but the same as the configuration of the commonly known conventional configuration.

Besides the configuration components described above, the charge pump implemented by this embodiment includes a stage-count changeover switch SW11 connected between the output terminal OUT and the connection node Nn–1, which is the connection node between the capacitor CBn–2 and the switch SWn–1. In addition, the charge pump implemented by this embodiment also includes a stage-count changeover switch SW12 connected between the output terminal OUT and the connection node Nn–3, which is the connection node between the capacitor CBn–4 and the switch SWn–3. The stage-count changeover switches SW11 and SW12 are turned on and off by respectively changeover signals EXC1 and EXC2 generated by the control logic unit 16.

When both the stage-count changeover switches SW11 and SW12 are turned off, the charge pump operates as if each of the stage-count changeover switches SW11 and SW12 were not provided. In this case, the circuit shown in FIG. 15 operates as a charge pump having (n–1) stages. When the stage-count changeover switch SW11 is turned on but the stage-count changeover switch SW12 is turned off, an electric charge flows from the connection node Nn–1 to the output terminal OUT by way of the stage-count changeover switch SW11. In this case, the circuit shown in FIG. 15 operates as a charge pump having (n–3) stages. When the stage-count changeover switch SW11 is turned off but the stage-count changeover switch SW12 is turned on, an electric charge flows from the connection node Nn–3 to the output terminal OUT by way of the stage-count changeover switch SW12. In this case, the circuit shown in FIG. 15 operates as a charge pump having (n–5) stages. That is, the charge pump shown in FIG. 15 has a configuration allowing the number of voltage-raising stages to be changed.

Figure 16A:
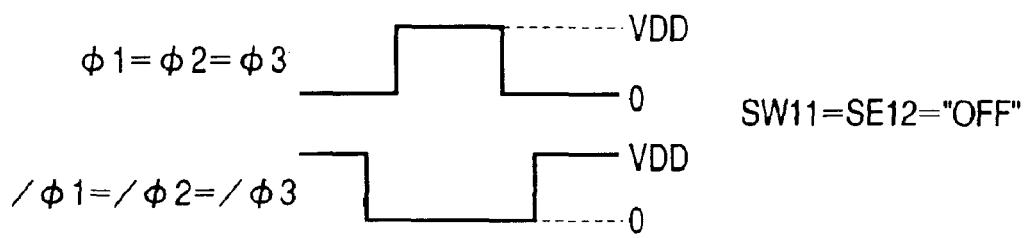
FIG. 16($a$) shows timings of the clock signals, which are supplied to the circuit shown in FIG. 15 when the circuit is operating as a charge pump having (n−1) stages.

FIG. 16(a) shows timings of the clock signals φ1 to φ3 and the clock signals /φ1 to /φ3, which are supplied to the circuit shown in FIG. 15 when the circuit is operating as a charge pump having (n–1) stages. As shown in the figure, the clock signals φ1 to φ3 operate with timings coinciding with each other whereas the clock signals /φ1 to /φ3 operate with timings coinciding with each other. In order to prevent a current from flowing in the reversed direction, the clock signals φ1 and /φ1 are supplied at phases opposite to each other and with timings causing the high-level periods thereof not to coincide with each other.

Figure 16B:
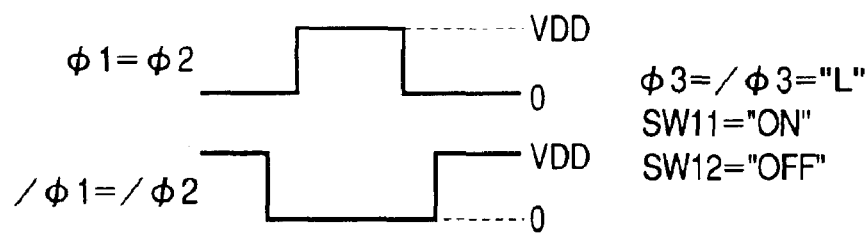

FIG. 16(b) shows timings of the clock signals φ1 and φ2 as well as the clock signals /φ1 and /φ2, which are supplied to the circuit shown in FIG. 15 when the circuit is operating as a charge pump having (n–3) stages. As shown in the figure, the clock signals φ1 and φ2 operate with timings coinciding with each other whereas the clock signals /φ1 and /φ2 operate with timings coinciding with each other. The clock signals φ3 and /φ3 are fixed at a low level.

Figure 16C:
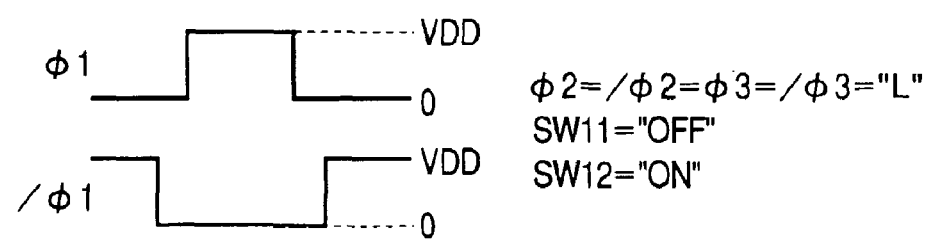

FIG. 16(c) shows timings of the clock signals φ 1 and /φ1, which are supplied to the circuit shown in FIG. 15 when the circuit is operating as a charge pump having (n–5) stages. The clock signals /φ2 and /φ2 as well as the clock signals /φ3 and /φ3 are fixed at a low level.

By the way, when the stage-count changeover switch SW11 is turned on to operate the circuit shown in FIG. 15 as a charge pump having (n–3) stages, a voltage-raising operation is carried out even if the switch SW–1 for transferring an electric charge is turned off by using the clock signal φ3 or the switch SWn for transferring an electric charge is turned off by using the clock signal /φ3. On the other hand, as shown in the figure, even when the stage-count changeover switch SW11 is turned on, an operation to turn on and off the switch SW–1 by using the clock signal φ1 or the switch SWn by using the clock signal /φ1 allows the capacitors CB–2 and CB–1 for raising a voltage to be used as smoothing capacitors. That is, the apparent capacitance of a smoothing capacitor CD can be increased. The above descrition holds true of a case in which the stage-count chageover switch SW12 is turned on to operate the circuit shown in FIG. 15 as a charge pump having (n–5) stages. In this case, the capacitors CBn–4, CBn–3, CBn–2 and CBn–1 for raising a voltage are each used as a smoothing capacitor.

The flash memory implemented by this embodiment executes control to change the number of charge-pump stages in accordance with the level of the power-supply voltage VCC. To put it concretely, the charge pump is controlled to operate at a small stage count of (n–5) for a high level of the power-supply voltage. For a low high level of the power-supply voltage, on the other hand, the charge pump is controlled to operate at a somewhat larger stage count of (n–3). If the level of the power-supply voltage is further lowered, the charge pump is controlled to operate at the maximum stage count of (n–1). Thus, a desired raised voltage can be obtained for both high and low levels of the power-supply voltage and, in addition, the magnitude of output ripples can be reduced. That is, the magnitude of output ripples for a high level of the power-supply voltage is generally large due to a small number of charge-pump stages in comparison with the magnitude of output ripples for a large number of charge-pump stages. In the case of this embodiment, however, the capacitance of the smoothing capacitor CD increases for a small number of charge-pump stages so that the magnitude of output ripples can be kept at a small value.

In accordance with an estimate made for a 128 MB flash memory developed by the inventors of the present invention, as is obvious from a result of an attempt to increase the capacitance of the smoothing capacitor CD without utilizing the capacitors CBn–4, CBn–3, CBn–2 and CBn–1 as smoothing capacitors, the area occupied by the smoothing capacitor CD needs to be increased to 0.18 mm$^2$, which is about 0.4% of the chip size or about 5% of an area occupied by the internal power-supply circuit 23. Thus, by applying this embodiment, the chip size can be reduced by about 0.4%.

Figure 17:
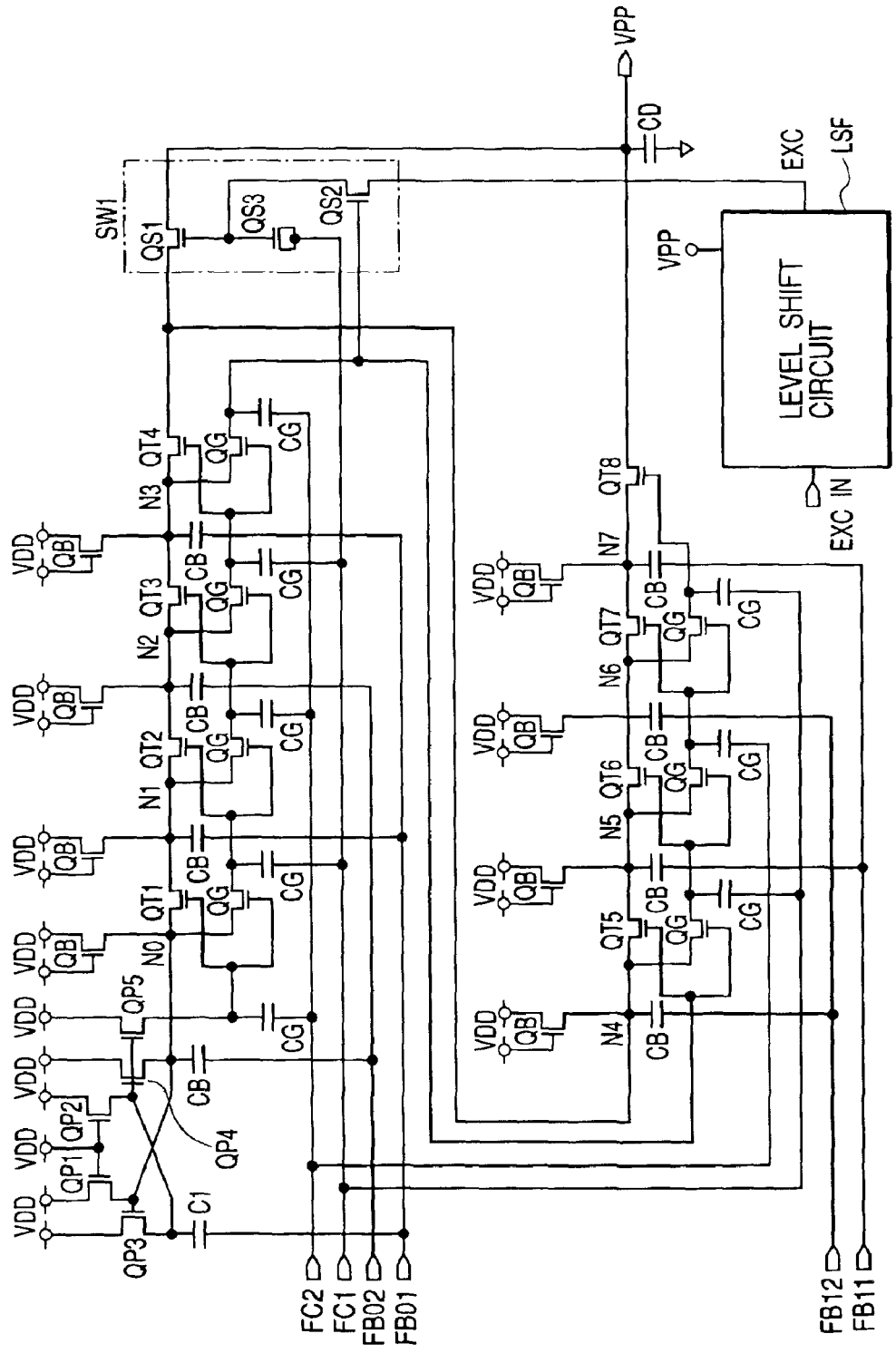
FIG. 17 is a circuit diagram showing another embodiment implementing a charge pump composing an internal power-supply circuit.

FIG. 17 is a diagram showing another embodiment implementing a charge pump composing the internal power-supply circuit 23. The charge pump implemented by this embodiment has a configuration in which the number of charge-pump stages in the charge pump can be changed from one value to another, that is, from 4 to 8 or vice versa, by turning a switch SW11 on and off. MOSFETs QT1 to QT8 are employed as switches for transferring an electric charge. The switches for transferring an electric charge correspond to the switches SW2 to SWn shown in FIG. 15. In addition, capacitor CGs are employed as boosting capacitors for increasing the efficiency of the electric-charge transfer by putting their respective switching MOSFETs QT1 to QT8 in a sufficiently deep on state. QG transistors are switching MOSFETs for electrically charging their respective boosting capacitors CG.

Even though not required specially in this embodiment, a MOSFET QB to serve as a diode is placed between the power-supply voltage terminal VCC and each of nodes N0 to N7 in such a configuration that an electric charge can be directly injected into each of the nodes N0 to N7 to shorten the propagation time at the start of a voltage-raising operation. It is to be noted that symbol LSF denotes a level shift circuit for shifting a changeover signal EXC for turning on and off the switch SW11, which is used for changing the number of charge-pump stages to a level close to a voltage-raising potential VPP. In the embodiment shown in FIG. 17, an N-channel MOSFET is employed as the switch SW11 for changing the number of charge-pump stages. However, a P-channel MOSFET can also be employed as well.

Figure 18A:
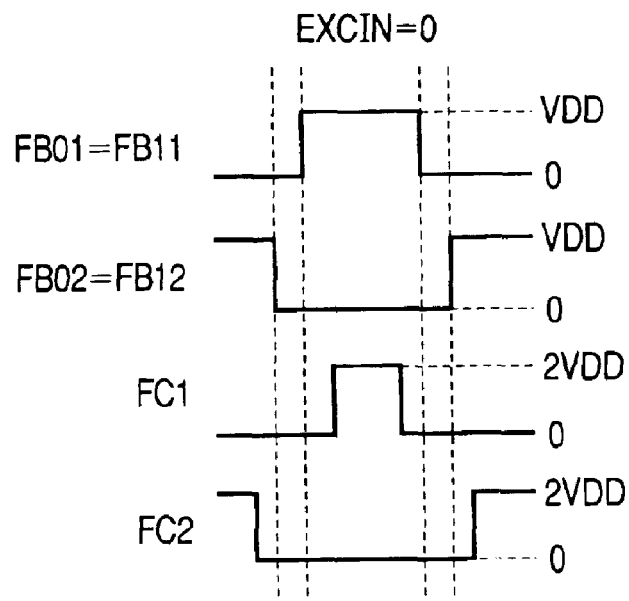
FIG. 18($a$) shows timing charts of clock signals, which are supplied to the circuit shown in FIG. 17 when the circuit is operating as a charge pump having a stage count of 8.
Figure 18B:
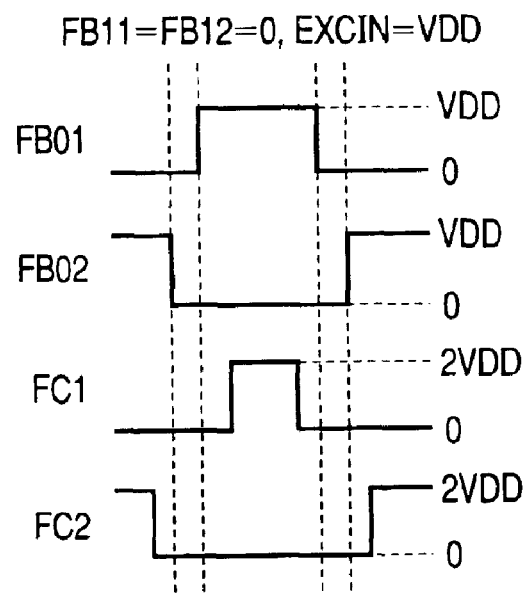

FIG. 18(a) shows timing charts of clock signals, which are supplied to the circuit shown in FIG. 17 when the circuit is operating as a charge pump having a stage count of 8. On the other hand, FIG. 18(b) shows timing charts of clock signals, which are supplied to the circuit shown in FIG. 17 when the circuit is operating as a charge pump having a stage count of 4. In the figures, symbols FB01, FB02, FB11 and FB12 each denote a clock signal for use in a voltage-raising operation. On the other hand, symbols FC1 and FC2 denote clock signals applied to the boosting capacitors CG in order to push up the gate voltages of the MOSFETs QT1 to QT8 for transferring an electric charge. When the circuit shown in FIG. 17 is operating as a charge pump having a stage count of 4, the switch SW11 is in an on state, in which the clock signals FB11 and FB12 are fixed at a low level of 0V. Also in the case of this embodiment, when the circuit shown in FIG. 17 is operating as a charge pump having a stage count of 4, the MOSFETs QT5 to QT8 for transferring an electric charge are controlled so that the voltage-raising capacitors CB at the rear stages are each employed as a smoothing capacitor.

Figure 19:
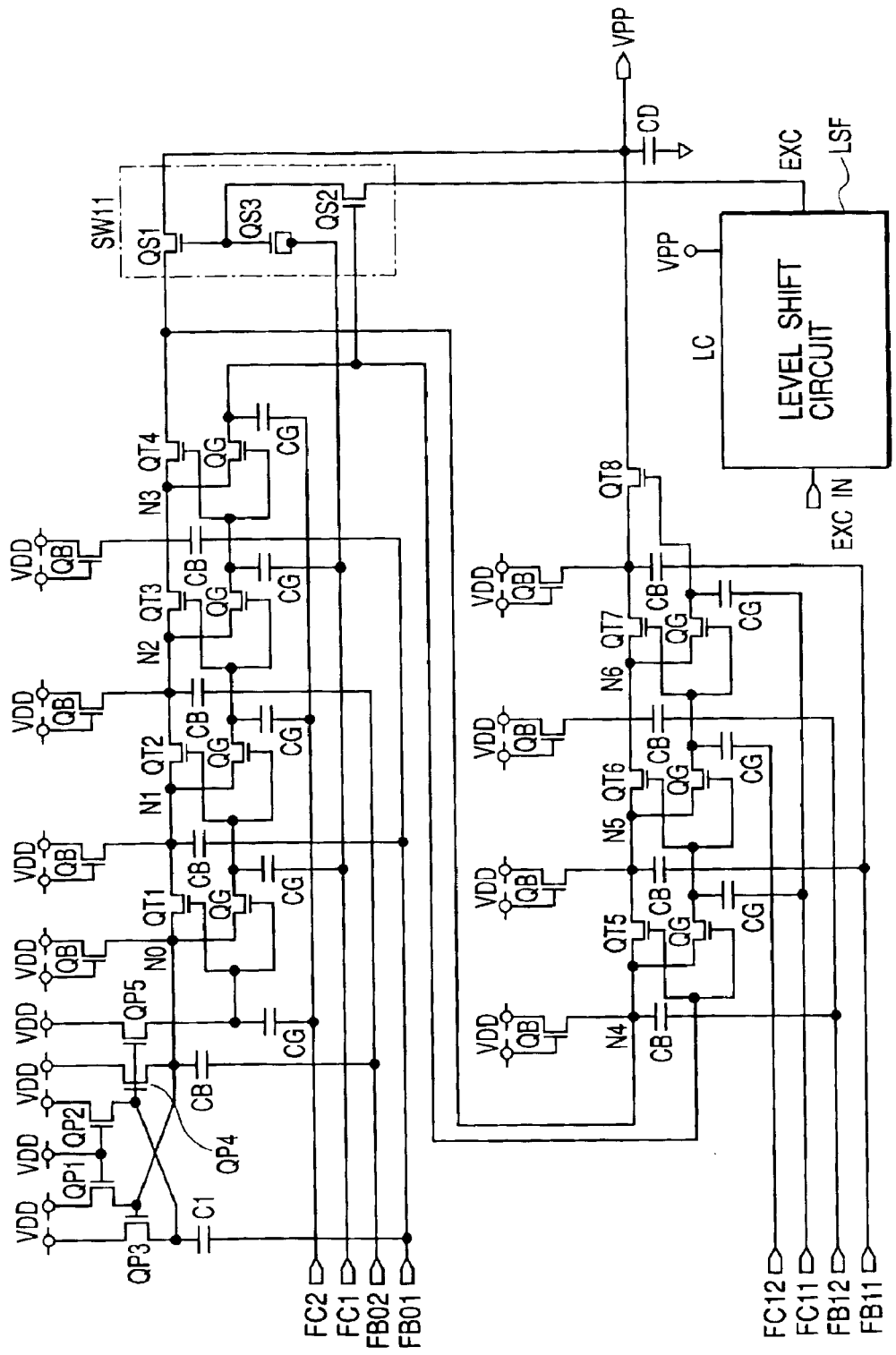
FIG. 19 is a circuit diagram showing a modified version of the charge pump shown in FIG. 17.

FIG. 19 is a diagram showing a further embodiment implementing a charge pump composing the internal power-supply circuit 23. The charge pump implemented by this embodiment is different from the charge pump implemented by the embodiment shown in FIG. 17 in that, in the case of the charge pump implemented by the embodiment shown in FIG. 17, the boosting clock signals FC01 and FC02 are used as clock signals common to the front and rear stages while, in the case of the charge pump implemented by the embodiment shown in FIG. 19, the boosting clock signals FC01 and FC02 are used for the front stage whereas boosting clock signals FC11 and FC12 are used for the rear stage.

Figure 20A:
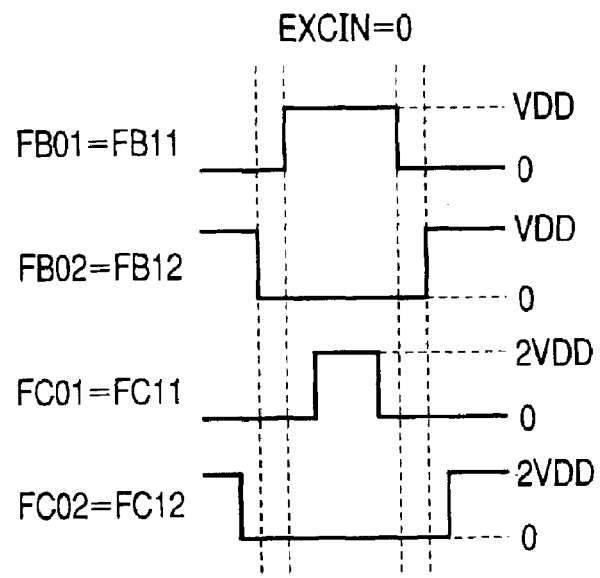
FIG. 20($a$) shows timing charts of clock signals, which are supplied to the circuit shown in FIG. 19 when the circuit is operating as a charge pump having a stage count of 8.
Figure 20B:
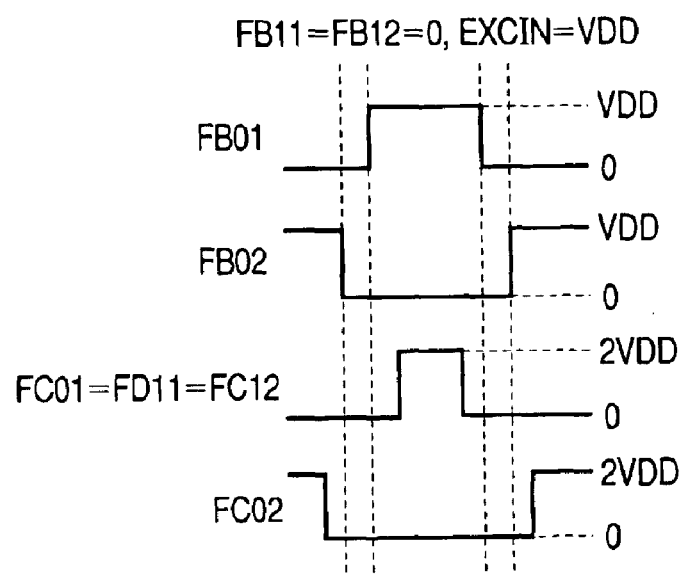

FIG. 20(a) shows timing charts of clock signals, which are applied to the circuit shown in FIG. 19 when the circuit is operating as a charge pump having a stage count of 8. On the other hand, FIG. 20(b) shows timing charts of clock signals, which are applied to the circuit shown in FIG. 19 when the circuit is operating as a charge pump having a stage count of 4. By operating the charge pump through application of the clock signals shown in FIG. 20, the efficiency of the smoothing capacitor CD in the circuit operating as a charge pump having a stage count of 4 can be further improved over that of the charge pump shown in FIG. 17.

Figure 21:
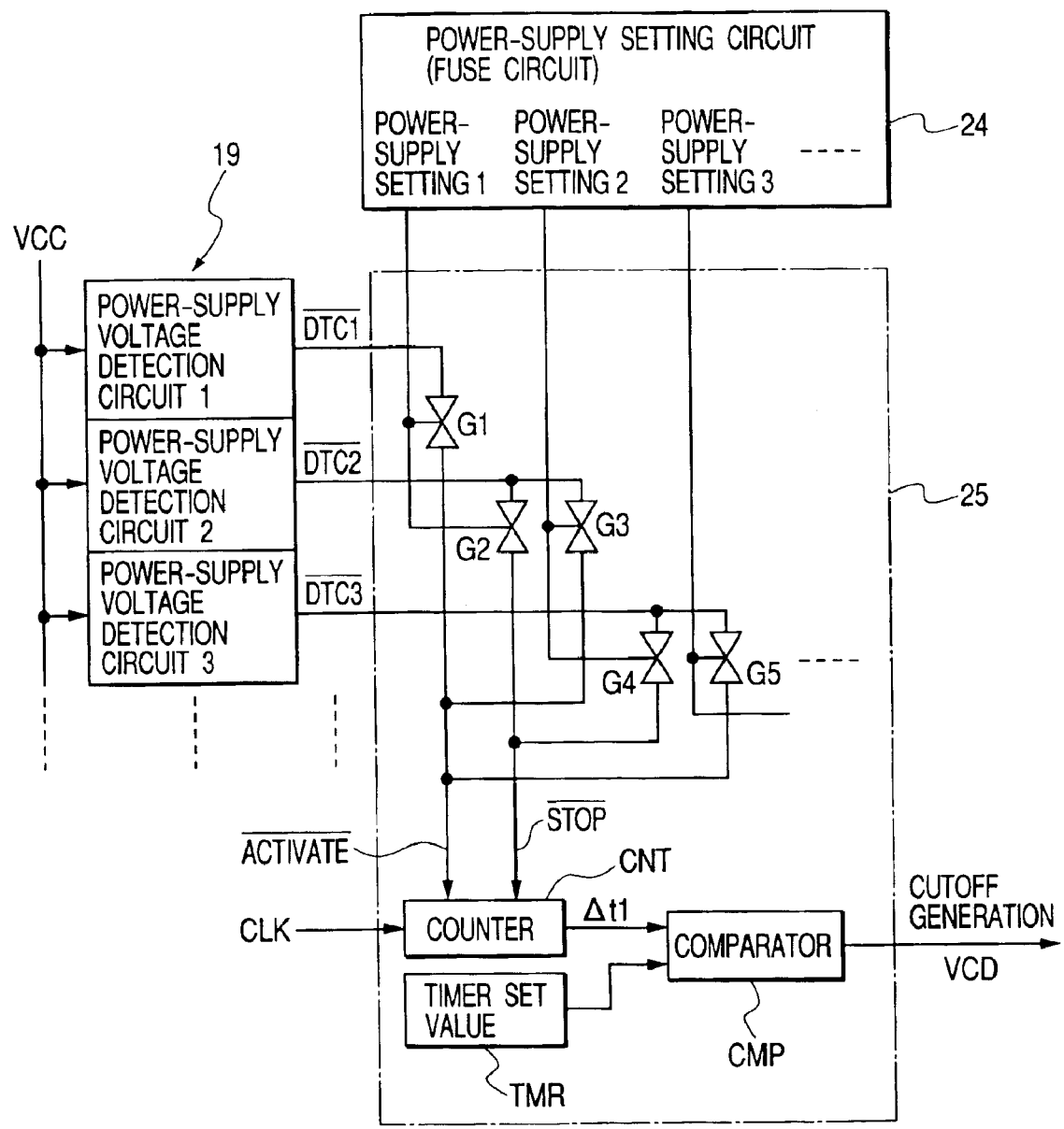
FIG. 21 is a block diagram showing a typical configuration of a power-supply cutoff detection unit employed in a flash memory having a power-supply cutoff detection circuit to serve as a modified version of the present invention.

Next, a modified version of the present invention is explained by referring to FIG. 21. As shown in the figure, the modified version employs a power-supply-setting circuit 24 for setting a power supply in accordance with the power-supply voltage VCC in use. The power-supply-setting circuit 24 is a fuse circuit including fuse devices. As the power-supply voltage detection circuit 19, the modified version employs a power-supply cutoff detection circuit 25 for detecting the level of the power-supply voltage VCC as a level of at least 3 stages. The charge pump capable of changing the number of charge-pump stages as described above may have a configuration in which the number of charge-pump stages is set in accordance with the power-supply setting in the power-supply-setting circuit 24.

The power-supply cutoff detection circuit 25 comprises gates G1, G2, G3, G4, G5 and so on, a counter CNT, a timer-setting register TMR and a comparator CMP. The gates G1, G2, G3, G4, G5 and so on are components for selectively passing through one of detections signals DTC1, DTC2, DTC3 and so on received from the power-supply voltage detection circuit 19. The counter CNT is a component for counting the number of pulses in an operating clock signal during a period of time between an activation signal and a stop signal. Used to start the counting operation of the counter CNT, the activation signal is a signal selected by the gates G1, G2, G3, G4, G5 and so on among the detections signals DTC1, DTC2, DTC3 and so on. Used to halt the counting operation of the counter CNT, on the other hand, the stop signal is a signal selected by the gates G1, G2, G3, G4, G5 and so on among the detections signals DTC1, DTC2, DTC3 and so on. The timer-setting register TMR is a component for storing a value toward which the counter CNT is counting. The value varies in dependence on the state of the power-supply setting in the power-supply-setting circuit 24. The comparator CMP is a component for comparing a count value output by the counter CNT with the value stored in the timer-setting register TMR.

If the power-supply-setting circuit 24 sets state 1 with the highest power-supply setting, the gates G1 and G2 are opened. In this state, the detection signals DTC1 and DTC2 received from the power-supply voltage detection circuit 19 are supplied to the counter CNT as the activation and stop signals respectively. If the power-supply-setting circuit 24 sets state 2 with a power-supply setting second to the highest one, on the other hand, the gates G3 and G5 are opened. In this state, the detection signals DTC2 and DTC3 received from the power-supply voltage detection circuit 19 are supplied to the counter CNT as the activation and stop signals respectively.

Figure 22:
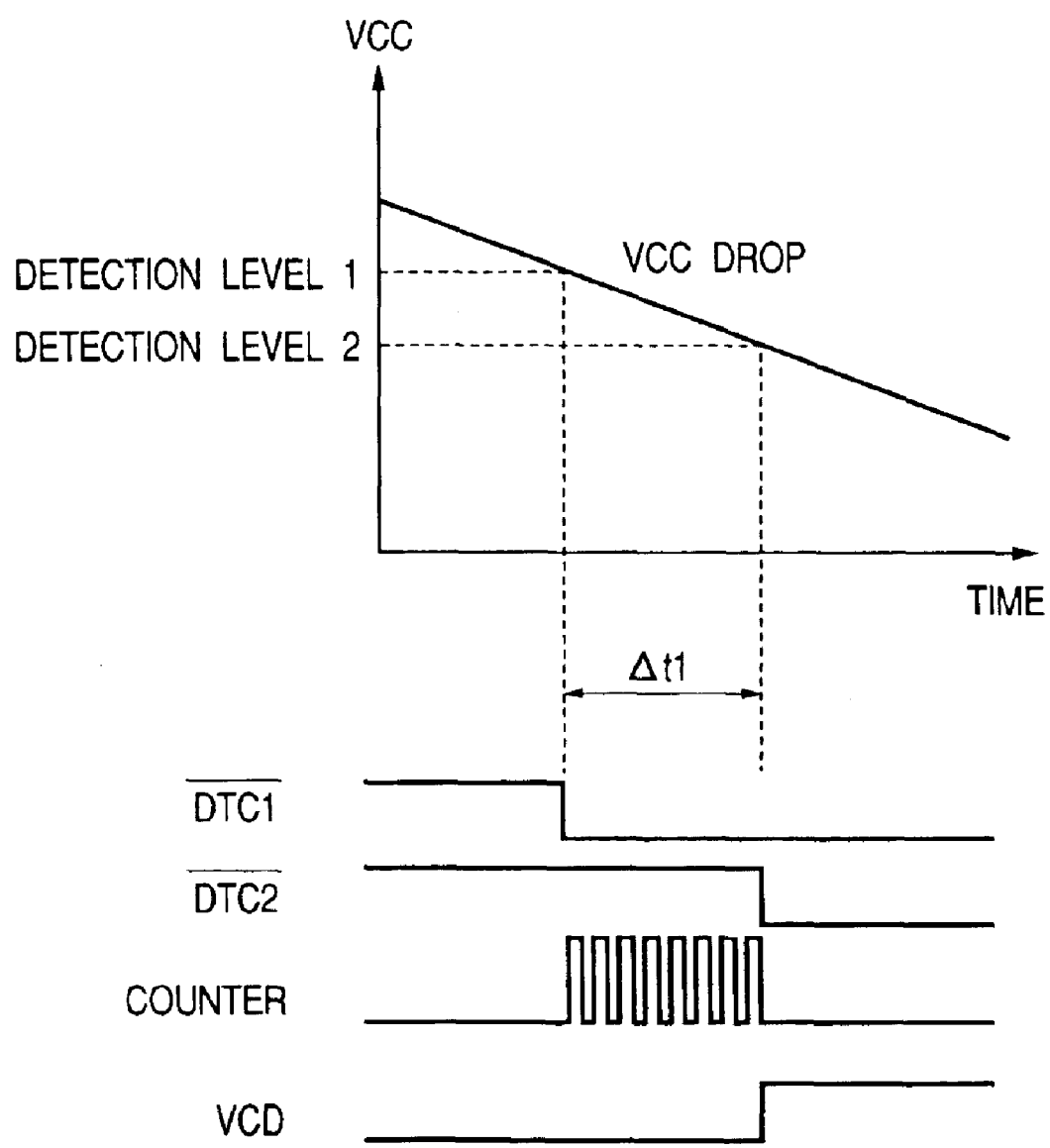
FIG. 22 is a waveform diagram showing typical operation waveforms of signals in the power-supply cutoff detection unit shown in FIG. 21.

FIG. 22 is a diagram showing waveforms of signals, which are generated with power-supply-setting state 1 established in the power-supply-setting circuit 24. When the power-supply voltage VCC decreases to detection level 1, the detection signal DTC1 changes from a high level to a low level, driving the counter CNT to start an operation to count the number of pulses in a clock signal. As the power-supply voltage VCC further decreases to detection level 2, the detection signal DTC2 changes from a high level to a low level, driving the counter CNT to stop the operation to count the number of pulses in the clock signal. At that time, if the count value output by the counter CNT is greater than the value stored in the timer-setting register TMR, a power-supply cutoff detection signal VCD output by the comparator CMP changes from a high level to a low level, notifying the control logic unit 16 that a cutoff of the power supply has occurred.

The present invention discovered by the inventors has been explained concretely by describing the embodiments of the present invention. However, the scope of the present invention is not limited to the described embodiments. It is of course possible to make a variety of changes in a range not departing from the essentials of the present invention. For example, the embodiments described above each implement a flash memory in which each memory cell can be used for storing 2 bits of data having one of 4 different values. However, the present invention can be applied to a flash memory in which each memory cell can be used for storing 1 bit of data having a binary value or 3 or more bits of data having one of several values.

In addition, in the embodiments described above, a memory cell in a state of a low threshold voltage is said to be a memory cell in a state of erased data and a memory cell in a state of a high threshold voltage is said to be a memory cell in a written-data state. However, the present invention can also be applied to a flash memory in which a memory cell in a state of a high threshold voltage is said to be a memory cell in a state of erased data and a memory cell in a state of a low threshold voltage is said to be a memory cell in a written-data state.

Furthermore, the embodiments described above each implement the so-called AND or NOR-typed flash memory in which a plurality of memory cells (MC) is connected in parallel to a pair of lines, namely, a bit line BL and a source line SL. However, the present invention can also be applied to a memory of another type such as the so-called NAND-typed flash memory or a non-volatile memory employing memory cells each having a MONOS structure. In a NAND-typed flash memory, memory cells are connected in series. In a flash memory of the NAND type or the like, all data in a block does not always become inaccurate because of the existence of a memory cell in a deplete state. By applying the present invention, however, it is possible to correct a memory cell remaining as it is in a depletion state caused by a cutoff of the power supply.

That is, by applying the technologies explained earlier with reference to FIGS. 8 to 14, it is possible to know the fact that data stored in a memory cell becomes inaccurate and unusable due to a power-supply cutoff occurring in the course of a write or erase operation. It is thus possible to avoid an undesirable result obtained from use of incorrect data stored in the memory cell. As another example, when a read operation command is received from the controller, a power-supply cutoff flag of a word line indicated by an address specified by the command is referenced to determine whether or not a cutoff of the power supply has occurred in the course of a write or erase operation. If a cutoff of the power supply has occurred, the controller reports a read error to an external device originating the read operation command. In addition, the controller may also notify the external device of detailed information indicating that a cutoff of the power supply has occurred. In addition, in the case of the so-called AND or NOR-typed flash memory, it is feared that the whole system no longer operates correctly due to the existence of a memory cell in a deplete state. For this reason, the embodiments described above each check whether or not a cutoff of the power supply has occurred in the course of a write or erase operation. In the case of an other-typed memory such as a NAND-typed memory, however, the whole system is still capable of operating even if a memory cell in a deplete state exists. Nevertheless, a verification operation can be carried out in reading and/or writing data from and/or into the memory.

The descriptions given above have explained embodiments in which the present invention discovered by the inventors is applied to a flash memory serving as an application field justified by the background of the present invention. However, the application range of the present invention is not limited to the flash memory. That is, the present invention can also be applied to a broad range of semiconductor memories employing non-volatile storage devices each used for storing information by changing a threshold voltage through application of a voltage.

The following description briefly explains effects obtained from representative implementations of the present invention disclosed in this specification.

In accordance with the present invention, it is possible to avoid a state in which data of a whole block cannot be read out correctly because of the fact that a memory cell in a deplete state exists in the block due to the occurrence of a power-supply cutoff prior to completion of a write or erase operation. This is because a write-back operation is carried out to raise the threshold voltage of the memory cell after the memory cell is put in the deplete state in the event of the power-supply cutoff.

In addition, by providing a flag for informing an external device such as a host CPU that a cutoff of the power supply has occurred in the course of a write or erase operation, the external device is capable of correcting data stored in a memory area damaged by the cutoff of the power supply. It is thus possible to recover the data stored in the memory area of the system after the data is damaged by the cutoff of the power supply. As a result, it is possible to avoid a state in which the memory can no longer be recognized or the system is not capable of carrying out a normal operation anymore.

Moreover, the memory is provided with a configuration in which the number of charge-pump stages in its internal power supply can be changed in accordance with the voltage of the power supply. Thus, the internal power supply is capable of operating at a power-supply voltage, which has been lowered by a cutoff of the power supply, to generate a desired voltage. As a result, it is possible to carry out a write-back operation with a high degree of reliability and improve the reliability of the memory.

What is claimed is:

1. A non-volatile semiconductor memory allowing information to be electrically written thereto and information stored therein to be electrically erased, comprising: a memory array including a plurality of non-volatile memory cells each used for storing information as a threshold voltage thereof, said non-volatile semiconductor memory allowing information to be written in predetermined units and stored information to be erased in said units, wherein, in the event of a power-supply cutoff in the course of a write or erase operation carried out on any specific one of said non-volatile memory cells, said write or erase operation currently being executed is discontinued and a write-back operation is carried out on said specific non-volatile memory cell to change said threshold voltage of said specific non-volatile memory cell in a direction to raise said threshold voltage.

2. A non-volatile semiconductor memory according to claim 1, including an external terminal for receiving a predetermined control signal, wherein, in accordance with a change in said control signal inputted to said external terminal, an occurrence of a power-supply cutoff is detected, and a write-back operation is carried out.

3. A non-volatile semiconductor memory according to claim 2, wherein said memory cells are each a memory cell with said threshold voltage thereof increased to a high level by a write operation and decreased by an erase operation, and wherein in the event of a power-supply cutoff in the course of a write or erase operation carried out on any specific one of said non-volatile memory cells, said threshold voltage of said specific non-volatile memory cell is examined to determine whether or not said threshold voltage has decreased to a predetermined level or a level even lower than said predetermined level and, if said threshold voltage has decreased to said predetermined level or a level even lower than said predetermined level, a bias voltage is applied in a direction to raise said threshold voltage of said specific non-volatile memory cell.

4. A non-volatile semiconductor memory according to claim 3, wherein, in an operation to update information stored in any selected one of said non-volatile memory cells, said threshold voltage of said selected non-volatile memory cell is once changed to a low level before being restored back to a high level.

5. A non-volatile semiconductor memory according to claim 4, wherein said memory array is a memory array having a plurality of memory columns each including a plurality of said memory cells connected in parallel.

6. A non-volatile semiconductor memory according to claim 5, further including a flag comprised of a non-volatile memory cell for storing an occurrence of a power-supply cutoff in the course of a write or erase operation.

7. A non-volatile semiconductor memory according to claim 6, wherein said flag is provided for each write-operation unit.

8. A non-volatile semiconductor memory according to claim 6, wherein address decode is configured to be hierarchically carried out, wherein there is provided a first flag group comprised of flags respectively corresponding to a plurality of first memory-cell groups selected by decode of a high-order address, and a second flag group comprised of flags respectively corresponding to a plurality of second memory-cell groups common in low-order address in said first memory-cell group, and wherein when a power-supply cutoff occurs in the course of write or erase operation with respect to the corresponding first and second memory-cell groups is performed, said first flag group and said second flag group are made to be a set state.

9. A non-volatile semiconductor memory according to claim 5, further including a non-volatile memory circuit for storing an address indicating a memory cell serving as a target of a write or erase operation in the event of a power-supply cutoff in the course of said write or erase operation.

10. A non-volatile semiconductor memory according to claim 9, further including a flag, which is used for indicating that an operation mode is a write operation mode or an erase operation mode if a power-supply cutoff occurs while an operation is being carried out in said write operation mode or said erase operation mode respectively.

11. A non-volatile semiconductor memory according to claim 9, wherein, at power supply starting, an address stored in said non-volatile memory circuit is read to a predetermined register.

12. A non-volatile semiconductor memory according to claim 11, wherein, in accordance with a predetermined command code or predetermined control signal received from an external source, the address stored in said register is outputted to outside.

13. A non-volatile semiconductor memory allowing information to be electrically written thereto and information stored therein to be electrically erased, comprising: a memory array including a plurality of non-volatile memory cells each used for storing information as a threshold voltage thereof; and an internal power-supply circuit for generating an internal power-supply voltage required for internal operations on the basis of an external power-supply voltage received from an external source, said non-volatile semiconductor memory allowing information to be written in predetermined units and stored information to be erased in said units, wherein said internal power-supply circuit is implemented into a configuration for generating said internal power-supply voltage varying in accordance with the level of said external power-supply voltage and, in the event of a power-supply cutoff in the course of a write or erase operation carried out on any specific one of said non-volatile memory cells, said write or erase operation currently being executed is discontinued and a write-back operation is carried out on said specific non-volatile memory cell to change said threshold voltage of said specific non-volatile memory cell in a direction to raise said threshold voltage.

14. A non-volatile semiconductor memory according to claim 13, wherein said internal power-supply circuit has a charge-pump circuit capable of changing the number of charge-pump stages, and said charge-pump circuit is implemented into a configuration allowing a voltage-raising capacitor at a voltage-raising stage not contributing to a voltage-raising operation to serve as a smoothing capacitor for a small number of said charge-pump stages.

15. A non-volatile semiconductor memory according to claim 14, further including a power-supply voltage detection circuit for detecting a level of a power-supply voltage received from an external source, wherein said charge-pump circuit changes the number of said charge-pump stages in accordance with said level detected by said power-supply voltage detection circuit.

* * * * *